US011463769B2

(12) United States Patent
Cooper et al.

(10) Patent No.: US 11,463,769 B2
(45) Date of Patent: *Oct. 4, 2022

(54) INVERTIBLE METERING APPARATUS AND RELATED METHODS

(71) Applicant: The Nielsen Company (US), LLC, New York, NY (US)

(72) Inventors: Timothy Scott Cooper, Oldsmar, FL (US); James Joseph Vitt, Palm Harbor, FL (US); Douglas Brent Turnbow, Odessa, FL (US); Marko Usaj, Ljubljana (SI); Andrej Barbis, Ilirska Bistrica (SI); Saso Vranek, Ilirska Bistrica (SI)

(73) Assignee: The Nielsen Company (US), LLC, New York, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 16/518,499

(22) Filed: Jul. 22, 2019

(65) Prior Publication Data
US 2019/0349632 A1 Nov. 14, 2019

Related U.S. Application Data

(63) Continuation of application No. 15/192,539, filed on Jun. 24, 2016, now Pat. No. 10,405,036.

(51) Int. Cl.
*H04L 12/14* (2006.01)
*H04N 21/442* (2011.01)
(Continued)

(52) U.S. Cl.
CPC . *H04N 21/44218* (2013.01); *H04N 21/44222* (2013.01); *H04N 21/812* (2013.01); *H05K 5/00* (2013.01); *H04L 12/1403* (2013.01)

(58) Field of Classification Search
CPC .................................................. H04L 12/1403
See application file for complete search history.

(56) References Cited

U.S. PATENT DOCUMENTS

| 3,665,889 A | 5/1972 | Wagenvoord |
| 4,566,033 A | 1/1986 | Reidenouer |
| (Continued) | | |

FOREIGN PATENT DOCUMENTS

| CN | 101371472 | 2/2009 |
| EP | 2261927 | 12/2010 |
| (Continued) | | |

OTHER PUBLICATIONS

European Patent Office, "Extended European Search Report," issued in connection with European Patent Application No. 17816218.6, dated Dec. 18, 2019, 8 pages.

(Continued)

*Primary Examiner* — Michael H Hong
(74) *Attorney, Agent, or Firm* — Hanley, Flight & Zimmerman, LLC

(57) ABSTRACT

Example invertible meter apparatus and related methods are disclosed. An example meter to monitor a media device includes a housing having a display and a plurality of walls. Respective ones of the walls are between respective ones of openings such that the openings are isolated from adjacent ones of the openings. A removable stencil includes a plurality of visual indicators, where the visual indicators to align with respective ones of the openings.

20 Claims, 12 Drawing Sheets

(51) Int. Cl.
*H04N 21/81* (2011.01)
*H05K 5/00* (2006.01)

(56) References Cited

U.S. PATENT DOCUMENTS

| | | |
|---|---|---|
| 4,652,337 A | 3/1987 | Picone et al. |
| 4,765,080 A | 8/1988 | Conti |
| 4,817,194 A | 3/1989 | Andros, Jr. |
| 4,905,080 A | 2/1990 | Watanabe et al. |
| 5,023,929 A | 6/1991 | Call |
| 5,102,081 A | 4/1992 | Barchus |
| 5,235,414 A | 8/1993 | Cohen |
| 5,450,490 A | 9/1995 | Jensen et al. |
| 5,481,294 A | 1/1996 | Thomas et al. |
| 5,521,578 A | 5/1996 | DelValle |
| 5,573,328 A | 11/1996 | Hwang |
| 5,828,992 A | 10/1998 | Kusmierczyk |
| 5,870,156 A | 2/1999 | Heembrock |
| 6,367,180 B2 * | 4/2002 | Weiss .............. G09F 13/04 40/544 |
| 6,401,373 B1 | 6/2002 | Sexton |
| 6,467,089 B1 | 10/2002 | Aust et al. |
| 6,484,316 B1 | 11/2002 | Lindberg |
| 7,864,120 B2 | 1/2011 | Dou et al. |
| 7,882,514 B2 | 2/2011 | Nielsen et al. |
| 7,978,176 B2 | 7/2011 | Forstall et al. |
| 8,035,497 B2 | 10/2011 | Ciccaglione et al. |
| 8,678,624 B2 | 3/2014 | Cave et al. |
| 8,717,285 B1 | 5/2014 | White et al. |
| 8,776,103 B2 | 7/2014 | Lu et al. |
| 9,016,906 B2 | 4/2015 | Cave et al. |
| 9,148,695 B2 * | 9/2015 | Nielsen .............. H04N 21/251 |
| 9,161,084 B1 | 10/2015 | Sharma et al. |
| 9,197,930 B2 | 11/2015 | Lee |
| 9,984,380 B2 | 5/2018 | Cooper et al. |
| 10,178,433 B2 | 1/2019 | Cooper et al. |
| 10,405,036 B2 | 9/2019 | Cooper et al. |
| 2002/0017045 A1 | 2/2002 | Weiss et al. |
| 2004/0221754 A1 | 11/2004 | Cochran et al. |
| 2005/0028692 A1 * | 2/2005 | Mellis .............. B43L 13/201 101/127.1 |
| 2007/0055290 A1 * | 3/2007 | Lober .............. A61B 90/39 606/130 |
| 2008/0049434 A1 | 2/2008 | Marsh |
| 2008/0136736 A1 | 6/2008 | Proctor et al. |
| 2008/0263579 A1 * | 10/2008 | Mears .............. H04N 21/435 725/9 |
| 2009/0052713 A1 | 2/2009 | Abe |
| 2009/0081823 A1 | 3/2009 | Meeus et al. |
| 2011/0050656 A1 | 3/2011 | Sakata et al. |
| 2011/0311083 A1 | 12/2011 | Bennett |
| 2012/0023516 A1 | 1/2012 | Wolinsky et al. |
| 2012/0081898 A1 * | 4/2012 | Cave .............. F21V 15/01 362/249.01 |
| 2012/0127012 A1 | 5/2012 | Gicklhom et al. |
| 2013/0258084 A1 | 10/2013 | Deng |
| 2014/0111964 A1 | 4/2014 | Cave et al. |
| 2014/0137143 A1 | 5/2014 | Ramaswamy et al. |
| 2015/0054694 A1 | 2/2015 | Chen et al. |
| 2015/0055329 A1 | 2/2015 | Demourtzidis |
| 2015/0281775 A1 | 10/2015 | Ramaswamy et al. |
| 2015/0365714 A1 | 12/2015 | Gildfind et al. |
| 2016/0049736 A1 | 2/2016 | Liu et al. |
| 2016/0109263 A1 | 4/2016 | Dubs |
| 2016/0357055 A1 | 12/2016 | Yeo |
| 2017/0372340 A1 | 12/2017 | Cooper et al. |
| 2017/0374413 A1 | 12/2017 | Cooper et al. |
| 2017/0374415 A1 | 12/2017 | Cooper et al. |
| 2018/0260831 A1 | 9/2018 | Cooper et al. |
| 2019/0090015 A1 | 3/2019 | Cooper et al. |
| 2019/0272554 A1 | 9/2019 | Cooper et al. |
| 2019/0349632 A1 | 11/2019 | Cooper et al. |

FOREIGN PATENT DOCUMENTS

| | | |
|---|---|---|
| EP | 3499185 | 6/2019 |
| JP | 08161079 | 6/1996 |
| JP | 2008182608 | 8/2008 |
| JP | 2010109760 | 5/2010 |
| WO | 9927668 | 6/1998 |
| WO | 2005032144 | 4/2005 |
| WO | 2013056193 | 4/2013 |
| WO | 2017223333 | 12/2017 |

OTHER PUBLICATIONS

Canadian Intellectual Property Office, "Examination Report," issued in connection with Canadian Patent Application No. 3,028,702, dated Nov. 7, 2019, 3 pages.

United States Patent and Trademark Office, "Final Office Action," issued in connection with U.S. Appl. No. 15/981,398, dated Nov. 4, 2019, 19 pages.

United States Patent and Trademark Office, "Non-Final Office Action," issued in connection with U.S. Appl. No. 16/418,690, dated Sep. 12, 2019, 21 pages.

United States Patent and Trademark Office, "Non-Final Office Action," issued in connection with U.S. Appl. No. 16/192,394, dated Mar. 5, 2020, 6 pages.

United States Patent and Trademark Office, "Advisory Action," issued in connection with U.S. Appl. No. 15/981,398, dated Apr. 2, 2020, 3 pages.

European Patent Office, Communication pursuant to Article 94(3) EPC, issued in connection with European Patent Application No. 18 215 638.0, dated Feb. 24, 2020, 7 pages.

United States Patent and Trademark Office, "Non-Final Office Action," issued in connection with U.S. Appl. No. 16/418,690 dated Feb. 28, 2020, 20 pages.

European Patent Office, "Extended European Search Report," issued in connection with European Patent Application No. 18215594.5, dated May 7, 2019, 7 pages.

European Patent Office, "Extended European Search Report," issued in connection with European Patent Application No. 18215638.0 dated Apr. 24, 2019, 9 pages.

International Bureau, "International Preliminary Report on Patentability," issued in connection with International Patent Application No. PCT/US2017/038784, dated Jan. 3, 2019, 13 pages.

United States Patent and Trademark Office, "Non-Final Office Action," issued in connection with U.S. Appl. No. 15/981,398, dated Jul. 26, 2018, 18 pages.

International Search Authority, "International Search Report," issued in connection with International Patent Application No. PCT/US2017/038784, dated Oct. 27, 2017, 5 pages.

International Search Authority, "Written Opinion," issued in connection with International Patent Application No. PCT/US2017/038784, dated Oct. 27, 2017, 11 pages.

United States Patent and Trademark Office, "Notice of Allowance and Fee(s) Due," issued in connection with U.S. Appl. No. 15/192,554, dated Aug. 2, 2018, 23 pages.

European Patent Office, "Communication pursuant to Rule 69 EPC," issued in connection with European Patent Application No. 18215638.0, dated Jun. 25, 2019, 2 pages.

United States Patent and Trademark Office, "Notice of Allowance and Fee(s) Due," issued in connection with U.S. Appl. No. 15/981,398, dated Jan. 24, 2019, 22 pages.

United States Patent and Trademark Office, "Non-Final Office Action," issued in connection with U.S. Appl. No. 15/192,554, dated Jan. 16, 2018, 34 pages.

United States Patent and Trademark Office, "Final Office Action," issued in connection with U.S. Appl. No. 15/192,560, dated Oct. 16, 2017, 19 pages.

United States Patent and Trademark Office, "Non-Final Office Action," issued in connection with U.S. Appl. No. 15/192,560, dated Jun. 28, 2017, 84 pages.

United States Patent and Trademark Office, "Non-Final Office Action," issued in connection with U.S. Appl. No. 15/192,539, dated Nov. 29, 2018, 12 pages.

(56) References Cited

OTHER PUBLICATIONS

United States Patent and Trademark Office, "Notice of Allowance and Fee(s) Due," issued in connection with U.S. Appl. No. 15/192,539, dated Apr. 9, 2019, 24 pages.

United States Patent and Trademark Office, "Non-Final Office Action," issued in connection with U.S. Appl. No. 15/192,539, dated Jan. 10, 2018, 32 pages.

United States Patent and Trademark Office, "Final Office Action," issued in connection with U.S. Appl. No. 15/192,539, dated Jun. 29 2018, 25 pages.

United States Patent and Trademark Office, "Notice of Allowance and Fee(s) Due," issued in connection with U.S. Appl. No. 15/192,560, dated Jan. 31, 2018, 23 pages.

United States Patent and Trademark Office, "Non-Final Office Action," issued in connection with U.S. Appl. No. 15/981,398, dated Jun. 27, 2019, 30 pages.

United States Patent and Trademark Office, "Notice of Allowance and Fee(s) Due," issued in connection with U.S. Appl. No. 16/192,394, dated Jul. 6, 2020, 8 pages.

United States Patent and Trademark Office, "Final Office Action," issued in connection with U.S. Appl. No. 16/418,690 dated Jul. 20, 2020, 24 pages.

United States Patent and Trademark Office, "Non-Final Office Action," issued in connection with U.S. Appl. No. 15/981,398, dated May 15, 2020, 18 pages.

China National Intellectual Property Administration, "First Notification of Office Action," issued in connection with Chinese Patent Application No. 201780040741.4, dated Jul. 29, 2020, 13 pages.

European Patent Office, "Communication under Rule 71(3) EPC," issued in connection with European Patent Application No. 18215638.0, dated Oct. 28, 2020, 7 pages.

United States Patent and Trademark Office, "Final Office Action," issued in connection with U.S. Appl. No. 15/981,398, dated Nov. 2, 2020, 22 pages.

United States Patent and Trademark Office, "Advisory Action," issued in connection with U.S. Appl. No. 16/418,690, dated Oct. 19, 2020, 3 pages.

European Patent Office, "Communication under Rule 71(3) EPC," issued in connection with European Patent Application No. 182155945, dated Mar. 2, 2021, 7 pages.

Canadian Intellectual Property Office, "Office Action," issued in connection with Canadian Patent Application No. 3,028,702, dated Feb. 17, 2021, 4 pages.

European Patent Office, "Extended European Search Report," issued in connection with European Patent Application No. 21161878.0, dated Mar. 29, 2021, 9 pages.

United States Patent and Trademark Office, "Non-Final Office Action," issued in connection with U.S. Appl. No. 15/981,398, dated Apr. 19, 2021, 11 pages.

China National Intellectual Property Administration, "Notification Of Second Office Action," issued in connection with Chinese Patent Application No. 201780040741.4, dated Apr. 30, 2021, 14 pages.

United States Patent and Trademark Office, "Notice of Allowance and Fee(s) Due," issued in connection with U.S. Appl. No. 16/418,690, dated Mar. 26, 2021, 7 pages.

European Patent Office, "Extended Search Report," issued in connection with European Patent Application No. 21191657.2-1209 dated Nov. 22, 2021, 5 pages.

European Patent Office, "Communication pursuant to Article 94(3) EPC," issued in connection with European Patent Application No. 17816218.6-1209 dated Dec. 6, 2021, 3 pages.

Canadian Intellectual Property Office, "Office Action," issued in connection with Canadian Patent Application No. 3,028,702 dated Jan. 5, 2022, 3 pages.

China National Intellectual Property Administration, "3rd Notification of Office Action," issued in connection with Chinese Patent Application No. 201780040741.4 dated Feb. 8, 2022, 9 pages including partial English translation.

* cited by examiner

INVERTIBLE METERING APPARATUS AND RELATED METHODS

CROSS REFERENCE TO RELATED APPLICATIONS

This patent arises from a continuation of U.S. patent application Ser. No. 15/192,539, (Now U.S. Pat. No. 10,405,036) which was filed on Jun. 24, 2016, which is hereby incorporated herein by reference in its entirety. Priority to U.S. patent application Ser. No. 15/192,539 is hereby claimed.

Additionally, this patent relates to subject matter disclosed in U.S. patent application Ser. No. 15/192,554, filed on Jun. 24, 2016, entitled invertible metering apparatus and related methods (Now U.S. Pat. No. 10,178,433), and U.S. patent application Ser. No. 15/192,560, filed on Jun. 24, 2016, entitled metering apparatus and related methods (Now U.S. Pat. No. 9,984,380). U.S. patent application Ser. No. 15/192,554, and U.S. patent application Ser. No. 15/192,560 are incorporated herein in their entireties.

FIELD OF DISCLOSURE

This patent is directed to metering devices and, more specifically, to invertible meter apparatus and related methods.

BACKGROUND

Monitoring companies monitor user interaction with media devices, such as smartphones, tablets, laptops, smart televisions, etc. To facilitate such monitoring, monitoring companies enlist panelists and install meters at the media presentation locations of those panelists. The meters monitor media presentations and transmit media monitoring information to a central facility of the monitoring company. Such media monitoring information enables the media monitoring companies to, among other things, monitor exposure to advertisements, determine advertisement effectiveness, determine user behavior, identify purchasing behavior associated with various demographics, etc.

BRIEF DESCRIPTION OF THE DRAWINGS

FIG. 1 illustrates the example meter in a first mounting orientation.

Figure 1:
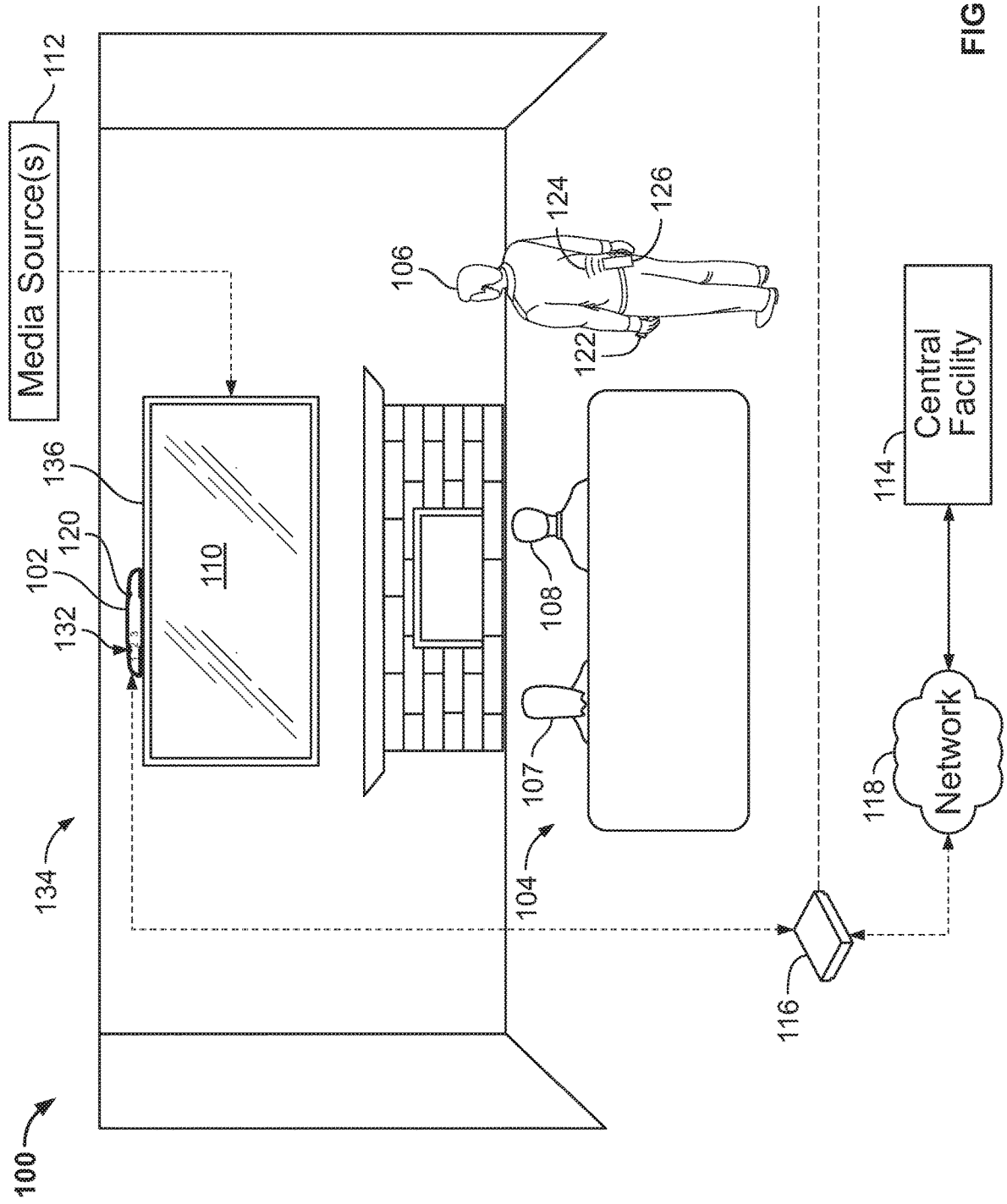
FIG. 1 illustrates an example audience measurement system with an example meter constructed in accordance with the teachings of this disclosure.

The figures are not to scale. Instead, to clarify multiple layers and regions, the thickness of the layers may be enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, means that the referenced part is either in contact with the other part, or that the referenced part is above the other part with one or more intermediate part(s) located therebetween. Stating that any part is in contact or directly engaged with another part means that there is no intermediate part between the two parts.

DETAILED DESCRIPTION

Audience measurement entities (also referred to herein as "ratings entities" or "monitoring companies") determine demographic reach for advertising and media programming based on registered panel members. That is, an audience measurement entity enrolls people that consent to being monitored into a panel. During enrollment, the audience measurement entity receives demographic information from the enrolling people so that subsequent correlations may be made between advertisement/media exposure to those panelists and different demographic markets. For example, monitoring companies desire knowledge on how users interact with media devices, such as smartphones, tablets, laptops, smart televisions, etc. In particular, media monitoring companies monitor media presentations made at the media devices to, among other things, monitor exposure to advertisements, determine advertisement effectiveness, determine user behavior, identify purchasing behavior associated with various demographics, etc.

As used herein, the term "media" includes any type of content and/or advertisement delivered via any type of distribution medium. Thus, media includes television programming or advertisements, radio programming or advertisements, movies, web sites, streaming media, etc.

Example metering devices are disclosed herein to monitor media presented by media devices. The example metering devices disclosed herein provide a modular display. The example modular display of the example metering devices disclosed herein enable various or different mounting configurations while presenting indicia or visual indicators of the display in an upright or proper orientation. In some examples, the modular display enables the metering device to be mounted in a first orientation (e.g., a first viewing orientation) or a second orientation (e.g., a second viewing orientation) different than the first orientation. For example, the first orientation may enable the metering device to be mounted above a television and the second orientation may enable the metering device to be mounted below a television. In some examples, a display of the metering device disclosed herein is in a first direction when the metering device is in the first orientation and the display is in a second direction opposite the first direction (e.g., an inverted orientation) when the metering device is in the second orientation. To enable proper display of indicia in an upright orientation when the metering device is in the first orientation or the second orientation, the example metering devices disclosed herein employ a removable and/or reversible display. For example, the display may be implemented by a removable stencil (e.g., an invertible stencil), removable diffusors and/or any other display to present indicia that may be removably coupled to a housing of the example meters disclosed herein. The display (e.g., a stencil or a plurality of diffusors), for example, includes indicia to be presented via the display of the example metering devices. In some examples, the modular display enables the metering device to display different indicia and/or the same indicia in a different orientation (e.g., a landscape orientation or a portrait orientation). In some examples, a display of the example metering device disclosed herein may present numeric indicia, alpha indicia, symbols, and/or any other indicia. In some examples, the indicia may be provided (e.g., printed) on a stencil having a unitary body. In some examples, the indicia may be provided on a plurality of diffusors that are removably coupled to the housing. In some examples, the indicia may be provided on a cover that removably attaches to the housing.

To enable the modular display, some example metering devices disclosed herein employ interchangeable stencils. For example, a first stencil disclosed herein may be interchangeable with a second stencil different from the first stencil. For example, the first stencil may be replaced by another stencil to change a mounting configuration of the example meter. In some examples, a first stencil disclosed herein may be interchanged with a second stencil having different visual indicators. For example, a first stencil disclosed herein having visual indicators in the form of numeric characters may be interchanged with a second stencil having different visual indicators in the form of symbols, alpha characters, alphanumeric characters and/or any other indicia or visual indicator.

FIG. 1 is an illustration of an example audience measurement system 100 having an example meter 102 constructed in accordance with the teachings of this disclosure to monitor an example media presentation environment 104. In the illustrated example of FIG. 1, the media presentation environment 104 includes panelists 106, 107, and 108, an example media device 110 that receives media from an example media source 112, and the meter 102. The meter 102 identifies the media presented by the media device 110 and reports media monitoring information to an example central facility 114 of an audience measurement entity via an example gateway 116 and an example network 118. The example meter 102 of FIG. 1 sends media identification data and/or audience identification data to the central facility 114 periodically, aperiodically and/or upon request by the central facility 114.

In the illustrated example of FIG. 1, the media presentation environment 104 is a room of a household (e.g., a room in a home of a panelist, such as the home of a "Nielsen family") that has been statistically selected to develop media (e.g., television) ratings data for a population/demographic of interest. In the illustrated example of FIG. 1, the example panelists 106, 107 and 108 of the household have been statistically selected to develop media ratings data (e.g., television ratings data) for a population/demographic of interest. People become panelists via, for example, a user interface presented on a media device (e.g., via the media device 110, via a website, etc.). People become panelists in additional or alternative manners such as, for example, via a telephone interview, by completing an online survey, etc. Additionally or alternatively, people may be contacted and/or enlisted using any desired methodology (e.g., random selection, statistical selection, phone solicitations, Internet advertisements, surveys, advertisements in shopping malls, product packaging, etc.). In some examples, an entire family may be enrolled as a household of panelists. That is, while a mother, a father, a son, and a daughter may each be identified as individual panelists, their viewing activities typically occur within the family's household.

In the illustrated example, one or more panelists 106, 107 and 108 of the household have registered with an audience measurement entity (e.g., by agreeing to be a panelist) and have provided their demographic information to the audience measurement entity as part of a registration process to enable associating demographics with media exposure activities (e.g., television exposure, radio exposure, Internet exposure, etc.). The demographic data includes, for example, age, gender, income level, educational level, marital status, geographic location, race, etc., of a panelist. While the example media presentation environment 104 is a household, the example media presentation environment 104 can additionally or alternatively be any other type(s) of environments such as, for example, a theater, a restaurant, a tavern, a retail location, an arena, etc.

In the illustrated example of FIG. 1, the example media device 110 is a television. However, the example media device 110 can correspond to any type of audio, video and/or multimedia presentation device capable of presenting media audibly and/or visually. In some examples, the media device 110 (e.g., a television) may communicate audio to another media presentation device (e.g., an audio/video receiver) for output by one or more speakers (e.g., surround sound speakers, a sound bar, etc.). As another example, the media device 110 can correspond to a multimedia computer system, a personal digital assistant, a cellular/mobile smartphone, a radio, a home theater system, stored audio and/or video played back from a memory such as a digital video recorder or a digital versatile disc, a webpage, and/or any other communication device capable of presenting media to an audience (e.g., the panelists 106, 107 and 108).

The media source 112 may be any type of media provider (s), such as, but not limited to, a cable media service provider, a radio frequency (RF) media provider, an Internet based provider (e.g., IPTV), a satellite media service provider, etc. The media may be radio media, television media, pay per view media, movies, Internet Protocol Television (IPTV), satellite television (TV), Internet radio, satellite radio, digital television, digital radio, stored media (e.g., a compact disk (CD), a Digital Versatile Disk (DVD), a Blu-ray disk, etc.), any other type(s) of broadcast, multicast and/or unicast medium, audio and/or video media presented (e.g., streamed) via the Internet, a video game, targeted broadcast, satellite broadcast, video on demand, etc.

The example media device 110 of the illustrated example shown in FIG. 1 is a device that receives media from the media source 112 for presentation. In some examples, the media device 110 is capable of directly presenting media (e.g., via a display) while, in other examples, the media device 110 presents the media on separate media presentation equipment (e.g., speakers, a display, etc.). Thus, as used herein, "media devices" may or may not be able to present media without assistance from a second device. Media devices are typically consumer electronics. For example, the media device 110 of the illustrated example could be a personal computer such as a laptop computer, and, thus, capable of directly presenting media (e.g., via an integrated and/or connected display and speakers). In some examples, the media device 110 can correspond to a television and/or display device that supports the National Television Standards Committee (NTSC) standard, the Phase Alternating Line (PAL) standard, the Système Électronique pour Couleur avec Mémoire (SECAM) standard, a standard developed by the Advanced Television Systems Committee (ATSC), such as high definition television (HDTV), a standard developed by the Digital Video Broadcasting (DVB) Project, etc. Advertising, such as an advertisement and/or a preview of other programming that is or will be offered by the media source 112, etc., is also typically included in the media. While a television is shown in the illustrated example, any other type(s) and/or number(s) of media device(s) may additionally or alternatively be used. For example, Internet-enabled mobile handsets (e.g., a smartphone, an iPod®, etc.), video game consoles (e.g., Xbox®, PlayStation 3, etc.), tablet computers (e.g., an iPad®, a Motorola™ Xoom™, etc.), digital media players (e.g., a Roku® media player, a Slingbox®, a Tivo®, etc.), smart televisions, desktop computers, laptop computers, servers, etc. may additionally or alternatively be used.

The example meter 102 detects exposure to media and electronically stores monitoring information (e.g., a code detected with the presented media, a signature of the presented media, an identifier of a panelist present at the time of the presentation, a timestamp of the time of the presentation) of the presented media. The stored monitoring information is then transmitted back to the central facility 114 via the gateway 116 and the network 118. While the media monitoring information is transmitted by electronic transmission in the illustrated example of FIG. 1, the media monitoring information may additionally or alternatively be transferred in any other manner, such as, for example, by physically mailing the meter 102, by physically mailing a memory of the meter 102, etc.

The meter 102 of the illustrated example of FIG. 1 combines audience measurement data and people metering data. For example, audience measurement data is determined by monitoring media output by the media device 110 and/or other media presentation device(s), and audience identification data (also referred to as demographic data, people monitoring data, etc.) is determined from people monitoring data provided to the meter 102. Thus, the example meter 102 provides dual functionality of a content measurement meter to collect content measurement data and people meter to collect and/or associate demographic information corresponding to the collected audience measurement data.

For example, the meter 102 of the illustrated example collects media identifying information and/or data (e.g., signature(s), fingerprint(s), code(s), tuned channel identification information, time of exposure information, etc.) and people data (e.g., user identifiers, demographic data associated with audience members, etc.). The media identifying information and the people data can be combined to generate, for example, media exposure data (e.g., ratings data) indicative of amount(s) and/or type(s) of people that were exposed to specific piece(s) of media distributed via the media device 110. To extract media identification data, the meter 102 and/or the example audience measurement system 100 extracts and/or processes the collected media identifying information and/or data received by the meter 102, which can be compared to reference data to perform source and/or content identification. Any other type(s) and/or number of media monitoring techniques can be supported by the meter 102.

Depending on the type(s) of metering the meter 102 is to perform, the meter 102 can be physically coupled to the media device 110 or may be configured to capture signals emitted externally by the media device 110 (e.g., free field audio) such that direct physical coupling to the media device 110 is not required. For example, the meter 102 of the illustrated example may employ non-invasive monitoring not involving any physical connection to the media device 110 (e.g., via Bluetooth® connection, WIFI® connection, acoustic watermarking, etc.) and/or invasive monitoring involving one or more physical connections to the media device 110 (e.g., via USB connection, a High Definition Media Interface (HDMI) connection, an Ethernet cable connection, etc.).

In examples disclosed herein, to monitor media presented by the media device 110, the meter 102 of the illustrated example employs audio watermarking techniques and/or signature based-metering techniques. Audio watermarking is a technique used to identify media, such as television broadcasts, radio broadcasts, advertisements (television and/or radio), downloaded media, streaming media, prepackaged media, etc. Existing audio watermarking techniques identify media by embedding one or more audio codes (e.g., one or more watermarks), such as media identifying information and/or an identifier that may be mapped to media identifying information, into an audio and/or video component of the media. In some examples, the audio or video component is selected to have a signal characteristic sufficient to hide the watermark. As used herein, the terms "code" or "watermark" are used interchangeably and are defined to mean any identification information (e.g., an identifier) that may be inserted or embedded in the audio or video of media (e.g., a program or advertisement) for the purpose of identifying the media or for another purpose such as tuning (e.g., a packet identifying header). As used herein "media" refers to audio and/or visual (still or moving) content and/or advertisements. To identify watermarked media, the watermark(s) are extracted and used to access a table of reference watermarks that are mapped to media identifying information.

Unlike media monitoring techniques based on codes and/or watermarks included with and/or embedded in the monitored media, fingerprint or signature-based media monitoring techniques generally use one or more inherent characteristics of the monitored media during a monitoring time interval to generate a substantially unique proxy for the media. Such a proxy is referred to as a signature or fingerprint, and can take any form (e.g., a series of digital values, a waveform, etc.) representative of any aspect(s) of the media signal(s) (e.g., the audio and/or video signals forming the media presentation being monitored). A signature may be a series of signatures collected in series over a timer interval. A good signature is repeatable when processing the same media presentation, but is unique relative to other (e.g., different) presentations of other (e.g., different) media. Accordingly, the term "fingerprint" and "signature" are used interchangeably herein and are defined herein to mean a proxy for identifying media that is generated from one or more inherent characteristics of the media.

Signature-based media monitoring generally involves determining (e.g., generating and/or collecting) signature(s) representative of a media signal (e.g., an audio signal and/or a video signal) output by a monitored media device and comparing the monitored signature(s) to one or more references signatures corresponding to known (e.g., reference) media sources. Various comparison criteria, such as a cross-correlation value, a Hamming distance, etc., can be evaluated to determine whether a monitored signature matches a particular reference signature. When a match between the monitored signature and one of the reference signatures is found, the monitored media can be identified as corresponding to the particular reference media represented by the reference signature that with matched the monitored signature. Because attributes, such as an identifier of the media, a presentation time, a broadcast channel, etc., are collected for the reference signature, these attributes may then be associated with the monitored media whose monitored signature matched the reference signature. Example systems for identifying media based on codes and/or signatures are long known and were first disclosed in Thomas, U.S. Pat. No. 5,481,294, which is hereby incorporated by reference in its entirety.

For example, the meter 102 of the illustrated example senses audio (e.g., acoustic signals or ambient audio) output (e.g., emitted) by the media device 110. For example, the meter 102 processes the signals obtained from the media device 110 to detect media and/or source identifying signals (e.g., audio watermarks) embedded in portion(s) (e.g., audio portions) of the media presented by the media device 110. To sense ambient audio output by the media device 110, the meter 102 of the illustrated example includes an example acoustic sensor 120 (e.g., a microphone). In some examples, the meter 102 may process audio signals obtained from the media device 110 via a direct cable connection to detect media and/or source identifying audio watermarks embedded in such audio signals. In some examples, the meter 102 may process audio signals and/or video signals to generate respective audio and/or video signatures from the media presented by the media device 110.

To generate exposure data for the media, identification(s) of media to which the audience is exposed are correlated with people data (e.g., presence information) collected by the meter 102. The meter 102 of the illustrated example collects inputs (e.g., audience identification data) representative of the identities of the audience member(s) (e.g., the panelists 106, 107 and 108). In some examples, the meter 102 collects audience identification data by periodically or aperiodically prompting audience members in the monitored media presentation environment 104 to identify themselves as present in the audience. In some examples, the meter 102 responds to predetermined events (e.g., when the media device 110 is turned on, a channel is changed, an infrared control signal is detected, etc.) by prompting the audience member(s) to self-identify. The audience identification data and the exposure data can then be complied with the demographic data collected from audience members such as, for example, the panelists 106, 107 and 108 during registration to develop metrics reflecting, for example, the demographic composition of the audience. The demographic data includes, for example, age, gender, income level, educational level, marital status, geographic location, race, etc., of the panelist.

In some examples, the meter 102 may be configured to receive panelist information via an example input device 122 such as, for example, a remote control, An Apple iPad®, a cell phone, etc.). In such examples, the meter 102 prompts the audience members to indicate their presence by pressing an appropriate input key on the input device 122. For example, the input device may enable the audience member(s) (e.g., the panelists 106, 107 and 108 of FIG. 1) and/or an unregistered user (e.g., a visitor to a panelist household) to input information to the meter 102 of FIG. 1. This information includes registration data to configure the meter 102 and/or demographic data to identify the audience member(s). For example, the input device 122 may include a gender input interface, an age input interface, and a panelist identification input interface, etc.

The meter 102 of the illustrated example may also determine times at which to prompt the audience members to enter information to the meter 102. In some examples, the meter 102 of FIG. 1 supports audio watermarking for people monitoring, which enables the meter 102 to detect the presence of a panelist-identifying metering device in the vicinity (e.g., in the media presentation environment 104) of the media device 110. In some examples, the acoustic sensor 120 of the meter 102 is able to sense example audio output 124 (e.g., emitted) by an example panelist-identifying metering device 126, such as, for example, a wristband, a cell phone, etc., that is uniquely associated with a particular panelist. The audio output 124 by the example panelist-identifying metering device 126 may include, for example, one or more audio watermarks to facilitate identification of the panelist-identifying metering device 126 and/or the panelist 106 associated with the panelist-identifying metering device 126.

The example gateway 116 of the illustrated example of FIG. 1 is a router that enables the meter 102 and/or other devices in the media presentation environment (e.g., the media device 110) to communicate with the network 118 (e.g., the Internet.)

In some examples, the example gateway 116 facilitates delivery of media from the media source 112 to the media device 110 via the Internet. In some examples, the example gateway 116 includes gateway functionality, such as modem capabilities. In some other examples, the example gateway 116 is implemented in two or more devices (e.g., a router, a modem, a switch, a firewall, etc.). The gateway 116 of the illustrated example may communicate with the network 118 via Ethernet, a digital subscriber line (DSL), a telephone line, a coaxial cable, a USB connection, a Bluetooth connection, any wireless connection, etc.

In some examples, the example gateway 116 hosts a Local Area Network (LAN) for the media presentation environment 104. In the illustrated example, the LAN is a wireless local area network (WLAN), and allows the meter 102, the media device 110, etc. to transmit and/or receive data via the Internet. Alternatively, the gateway 116 may be coupled to such a LAN. In some examples, the gateway 116 may be implemented with the example meter 102 disclosed herein.

In some examples, the gateway 116 may not be provided. In some such examples, the meter 102 may communicate with the central facility 114 via cellular communication (e.g., the meter 102 may employ a built-in cellular modem).

The network 118 of the illustrated example is a wide area network (WAN) such as the Internet. However, in some examples, local networks may additionally or alternatively be used. Moreover, the example network 118 may be implemented using any type of public or private network, such as, but not limited to, the Internet, a telephone network, a local area network (LAN), a cable network, and/or a wireless network, or any combination thereof.

The central facility 114 of the illustrated example is implemented by one or more servers. The central facility 114 processes and stores data received from the meter 102. For example, the example central facility 114 of FIG. 1 combines audience identification data and program identification data from multiple households to generate aggregated media monitoring information. The central facility 114 generates reports for advertisers, program producers and/or other interested parties based on the compiled statistical data. Such reports include extrapolations about the size and demographic composition of audiences of content, channels and/or advertisements based on the demographics and behavior of the monitored panelists.

As noted above, the meter 102 of the illustrated example provides a combination of media (e.g., content) metering and people metering. The example meter 102 of FIG. 1 is a stationary device that may be disposed on or near the media device 110. The meter 102 of FIG. 1 includes its own housing, processor, memory and/or software to perform the desired audience measurement and/or people monitoring functions.

In examples disclosed herein, an audience measurement entity provides the meter 102 to the panelist 106, 107 and 108 (or household of panelists) such that the meter 102 may be installed by the panelist 106, 107 and 108 by simply powering the meter 102 and placing the meter 102 in the media presentation environment 104 and/or near the media device 110 (e.g., near a television set). In some examples, more complex installation activities may be performed such as, for example, affixing the meter 102 to the media device 110, electronically connecting the meter 102 to the media device 110, etc.

To identify and/or confirm the presence of a panelist present in the media device 110, the example meter 102 of the illustrated example includes an example display 132. For example, the display 132 provides identification of the panelists 106, 107, 108 present in the media presentation environment 104. For example, in the illustrated example, the meter 102 displays indicia or visual indicators (e.g., illuminated numerals 1, 2 and 3) identifying and/or confirming the presence of the first panelist 106, the second panelist 107 and the third panelist 108.

The meter 102 of the illustrated example may be affixed to the media device 110 in any orientation such as, for example, above the media device 110, on a side of the media device 110, on the bottom of the media device 110, etc. For example, the meter 102 of the illustrated example is capable of invertible mounting (e.g., with a primary orientation for above-television mounting and an inverted orientation for below-television mounting). The different configurable orientations of the meter 102 enables flexibility when placing the meter 102 in different locations (e.g., on the media device 110, on a ceiling mounted television, a shelf, etc.) depending on footprint constraints of the media presentation environment 104 and/or the media device 110. To this end, the example meter 102 of the illustrated example provides a relatively small or narrow dimensional footprint (e.g., a relatively small thickness and/or height). Additionally, the orientation of the meter 102 may be configured at a manufacturing facility, a ratings company, in the field at the media presentation environment 104, and/or any other location.

To enable different mounting configurations of the example meter 102 disclosed herein, the example modular display 132 of the example meter 102 is a modular. For example, the display 132 may be configured based on the mounting orientation of the meter 102. To enable presentation of indicia in an upright or right side up orientation via the display 132, the meter 102 of the illustrated example includes a removable stencil. For example, the stencil may be removed from the display 132 and may be re-oriented based on the mounting orientation of the meter 102. In some examples, an example stencil disclosed herein may be replaced or interchanged with a different stencil to present different indicia. For example, the display 132 of the illustrated example presents indicia having numerals. However, in some examples, the display 132 may be configured to present indicia having letter(s), symbols, and/or any other indicia, and/or any combination thereof.

In the illustrated example of FIG. 1, the meter 102 is affixed or mounted to the media device 110 in a first mounting orientation 134. In the illustrated example, the first mounting orientation 134 provides an above-media device mounting configuration (e.g., an above-television mounting configuration), which places the display 132 in a landscape orientation relative to the media device 110. For example, the meter 102 is shown in a right-side up orientation in FIG. 1. The meter 102 of the illustrated example may be coupled (e.g., directly attached) to a surface 136 (e.g., an upper surface) of the media device 110. In the first mounting orientation 134, the display 132 of the illustrated example displays the visual indicators or indicia in an upright orientation. For example, the meter 102 of the illustrated example displays the visual indicators or indicia in a landscape configuration in ascending order from left to right in the orientation of FIG. 1. Alternatively, the meter 102 of the illustrated example may not be fixed to the media device 110. For example, the meter 102 may be placed in a location near the media device 110.

Figure 2:
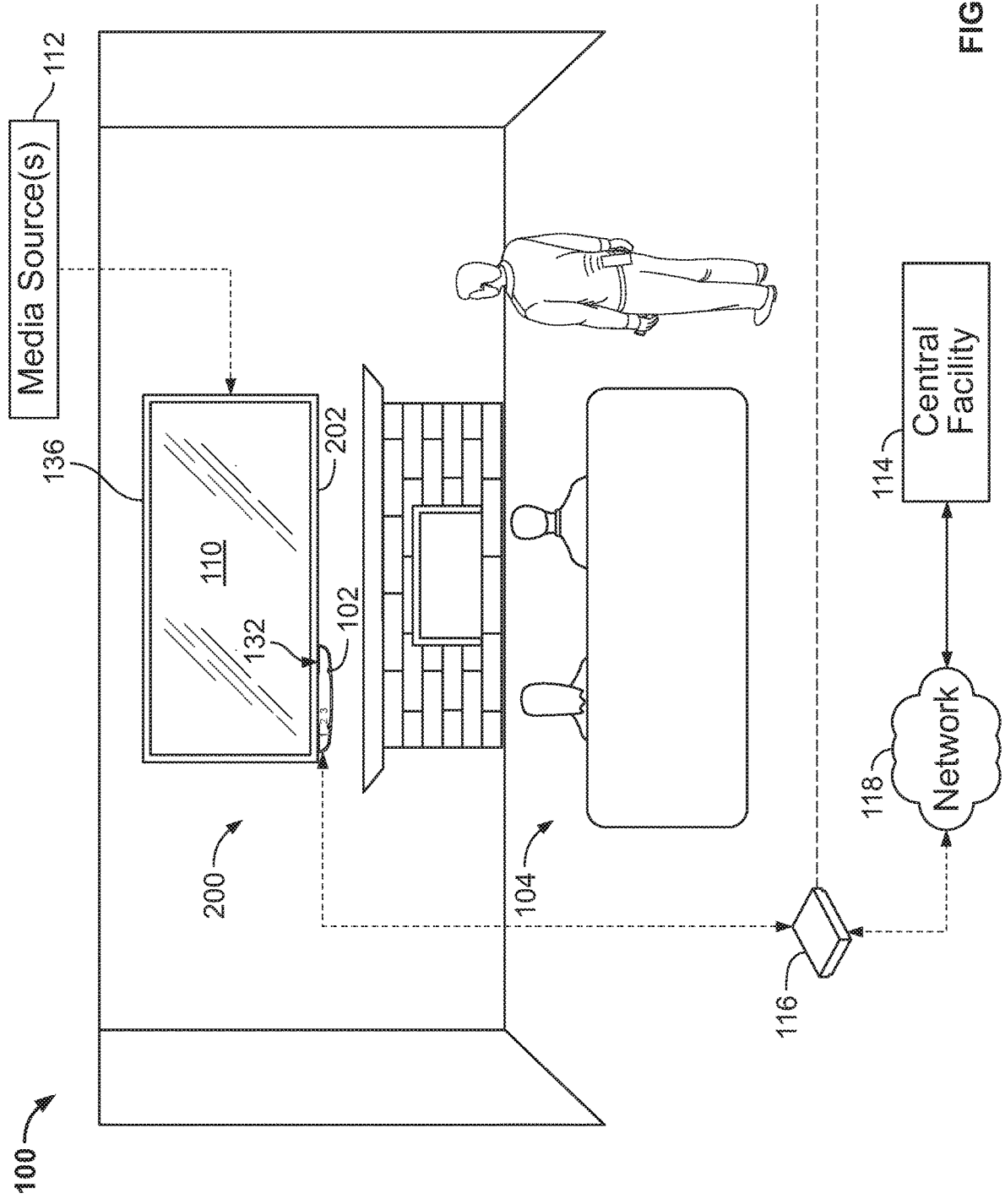
FIG. 2 illustrates the example audience measurement system of FIG. 1 with the example meter in a second mounting orientation.

FIG. 2 illustrates the example media presentation environment 104 of FIG. 1 with the meter 102 of the illustrated example in a second mounting orientation 200. In the second mounting orientation 200, the meter 102 of the illustrated example of FIG. 2 provides a below-media device mounting configuration (e.g., a below-television mounting configuration), which also places the display 132 in a landscape orientation relative to the media device 110. For example, the meter 102 shown in the illustrated example of FIG. 2 is inverted (e.g., upside down) relative to the orientation of the meter 102 shown in FIG. 1. The meter 102 of the illustrated example may be coupled (e.g., directly attached) to a surface 202 (e.g., a lower surface) of the media device 110 (e.g., that is opposite the mounting surface 136). Although the meter 102 provided in the second mounting orientation 200 is flipped upside down compared to the first mounting orientation 134 of FIG. 1, the display 132 of the example meter 102 displays the indicia in an upright orientation. In other words, although the meter 102 is turned upside-down, the indicia presented by the display 132 is presented in an upright orientation. In the second mounting orientation 200, the display 132 of the illustrated example displays indicia in a landscape orientation in ascending order from left to right, similar to the orientation of FIG. 1.

Figure 3:
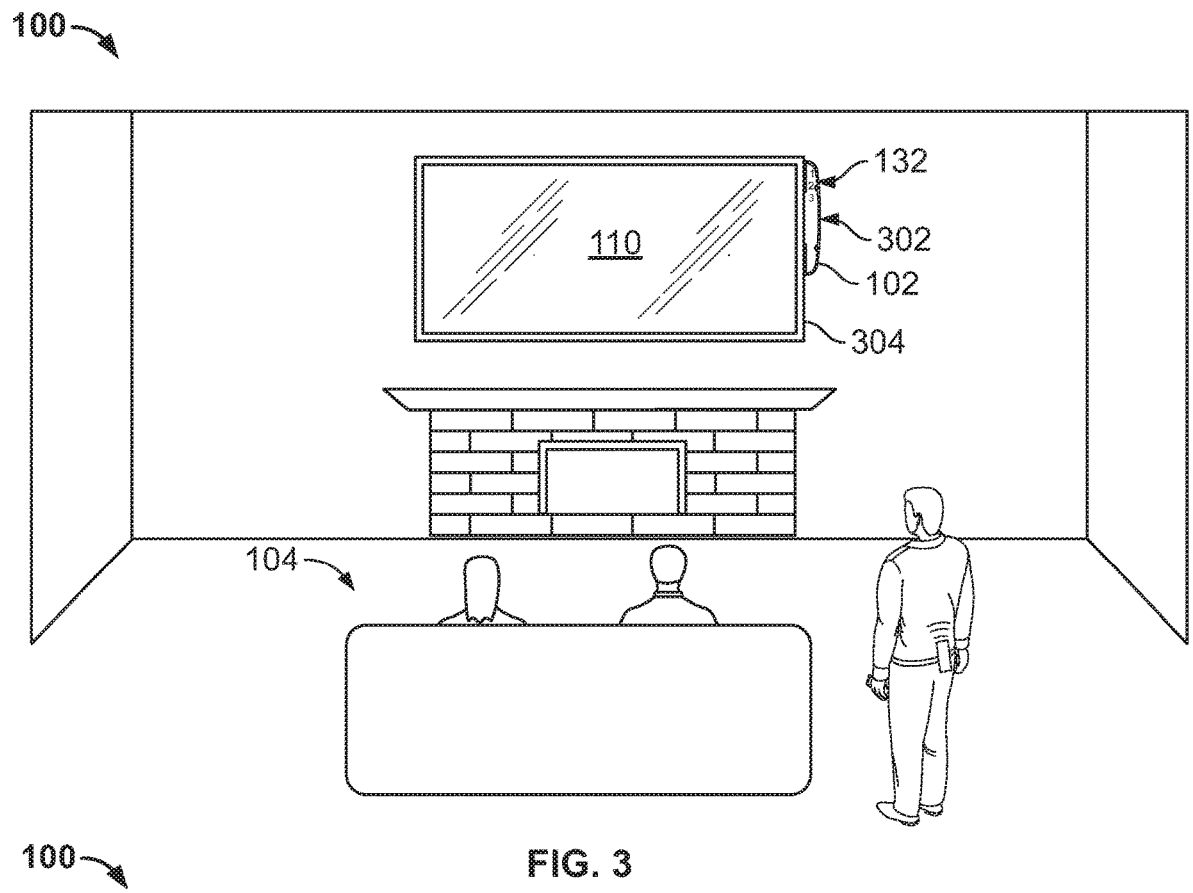
FIG. 3 illustrates the example audience measurement system of FIG. 1 with the example meter in a third mounting orientation.

FIG. 3 illustrates the example media presentation environment 104 of FIG. 1 with the example meter 102 of the illustrated example in a third mounting orientation 300 relative to the media device 110. In the third mounting orientation 300, the meter 102 of the illustrated example may be configured for a right-side media device mounting configuration, which places the display 132 in a portrait orientation relative to the media device 110. For example, the meter 102 of the illustrated example may be coupled (e.g. directly attached) to a surface 304 of the media device 110 (e.g., a vertical or right lateral surface in the orientation of FIG. 1).

Figure 4:
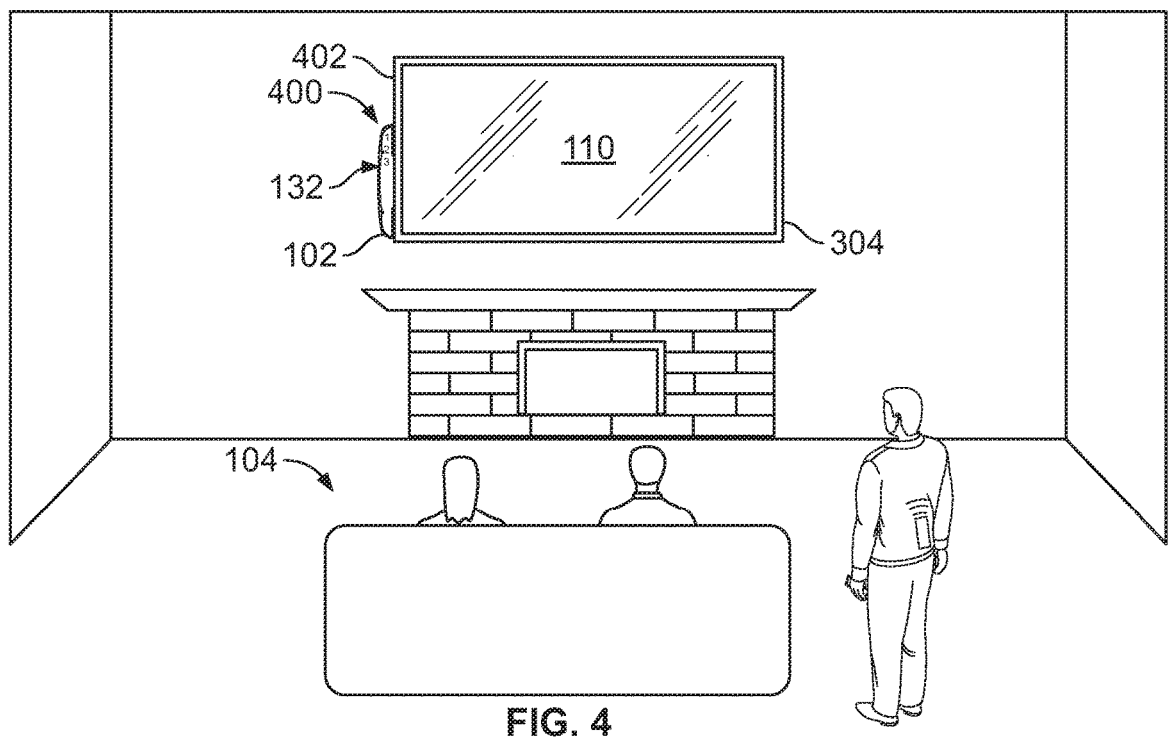
FIG. 4 illustrates the example audience measurement system of FIG. 1 with the example meter in a fourth mounting orientation.

FIG. 4 illustrates the example media presentation environment 104 of FIG. 1 with the example meter 102 of the illustrated example in a fourth mounting orientation 400 relative to the media device 110. In the fourth mounting orientation 400, the meter 102 of the illustrated example may be configured for a left-side media device mounting configuration, which also places the display 132 in a portrait orientation relative to the media device 110. For example, the meter 102 of the illustrated example may be coupled (e.g. directly attached) to a surface 402 of the media device 110 (e.g., a vertical or left lateral surface in the orientation of FIG. 1) opposite the surface 304.

In either of the third mounting orientation 300 or the fourth mounting orientation 400, the meter 102 of the illustrated example displays indicia in an upright orientation (e.g., a right side up orientation). In particular, the meter 102 of the illustrated example displays the indicia in a portrait configuration relative to the media device 110 when the meter 102 is positioned in the third mounting orientation 300 or the fourth mounting orientation 400. For example, the display 132 presents indicia (e.g., numerals 1, 2, and 3) in a portrait orientation in ascending order from top to bottom in the orientation of FIG. 3. By employing a modular display 132, a mounting orientation of the meter 102 of the illustrated example may be varied and the indicia presented by the display 132 is presented in a right side up or upright orientation (e.g., a top to bottom orientation).

Figure 5:
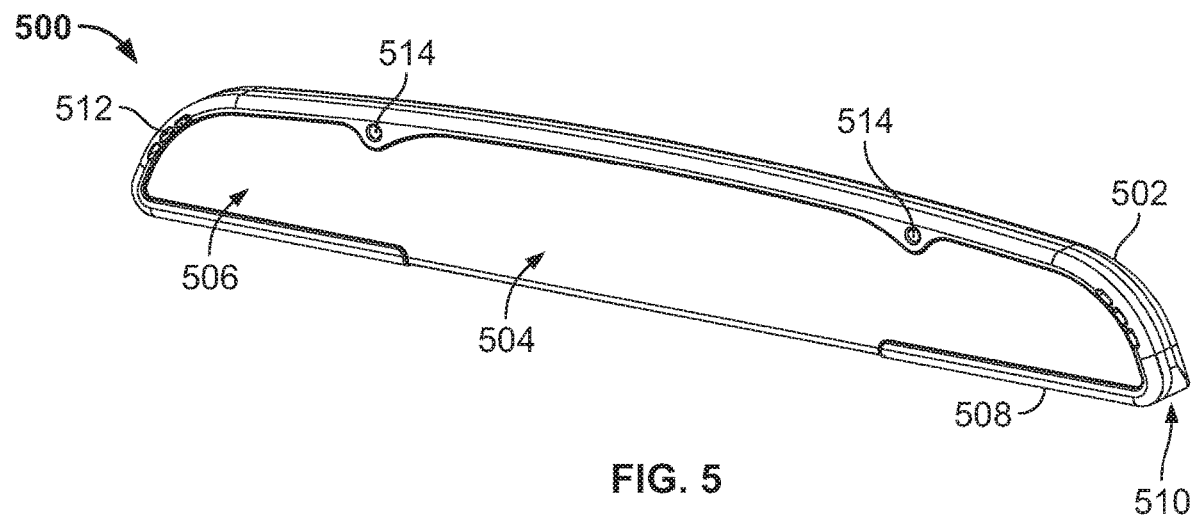
FIG. 5 is a perspective view of an example meter disclosed herein that may be used to implement the audience measurement system of FIG. 1.

FIG. 5 is a perspective, front view of an example meter 500 constructed in accordance with the teachings of this disclosure. The example meter 500 of FIG. 5 may implement the example meter 102 and/or the example audience measurement system 100 of FIGS. 1-4. The meter 500 of the illustrated example combines people metering and media (e.g., content) metering in a single housing 502. To display panelist information, the meter 500 of the illustrated example includes an example display 504. The display 504 of the illustrated example is provided at a front side 506 of the meter 500. In particular, the display 504 of the illustrated example is a modular display. As described in greater detail below, the modular display of the example meter 500 enables various or different mounting configurations or orientations, such as, for example, the mounting orientations 134, 200, 300 and 400 shown in FIGS. 1-4. In addition, regardless of the mounting orientation, the display 504 of the example meter 500 presents presenting indicia or visual indicators in an upright or proper orientation.

To mount or couple the meter to a surface or edge of a media presentation device (e.g., the media device 110 of FIGS. 1-3), the meter 500 of the illustrated example includes a mounting surface 508. The mounting surface 508 of the illustrated example is at a bottom side 510 of the example meter 500. For example, the bottom side 510 of the meter of the illustrated example is substantially perpendicular to the front side 506 of the meter 500. The meter 500 of the illustrated example includes an example opening 512 for audio output (e.g., via a speaker) and/or an example opening 514 to receive audio (e.g., via a microphone) generated by a media device (e.g., audio output of the example media device 110 of FIG. 1).

Figure 6:
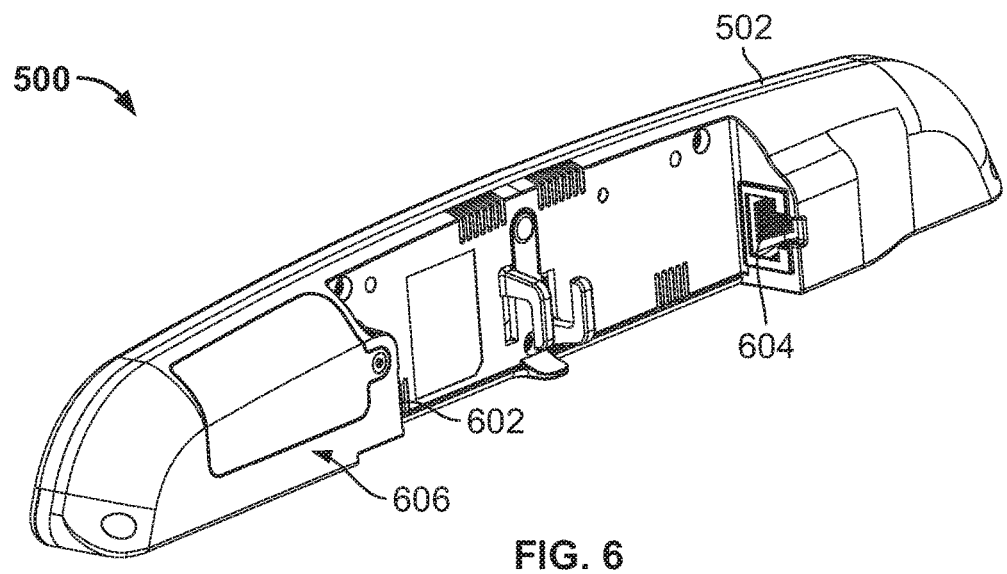
FIG. 6 is a perspective, rear view of the example meter of FIG. 5.

FIG. 6 is a perspective, rear view of the example meter of FIG. 5. The example meter 500 of the illustrated example employs an example first connector 602 and an example second connector 604 accessible via a rear side 606 of the housing 502. The first connector 602 and/or the second connector 604 of the illustrated example enables communication between, for example, the meter 500 and the media device 110 and/or the gateway 116 of FIGS. 1-4. The first connector 602 of the illustrated example is a USB connector and the second connector 604 of the illustrated example is an Ethernet connector (e.g., RJ45 jack, Cat5e connector, etc.). However, in some examples, the first connector 602 and/or the second connector 604 may be, for example, a power connector, a microUSB connector, coaxial cable connector, and/or any other type of connector(s).

Figure 7:
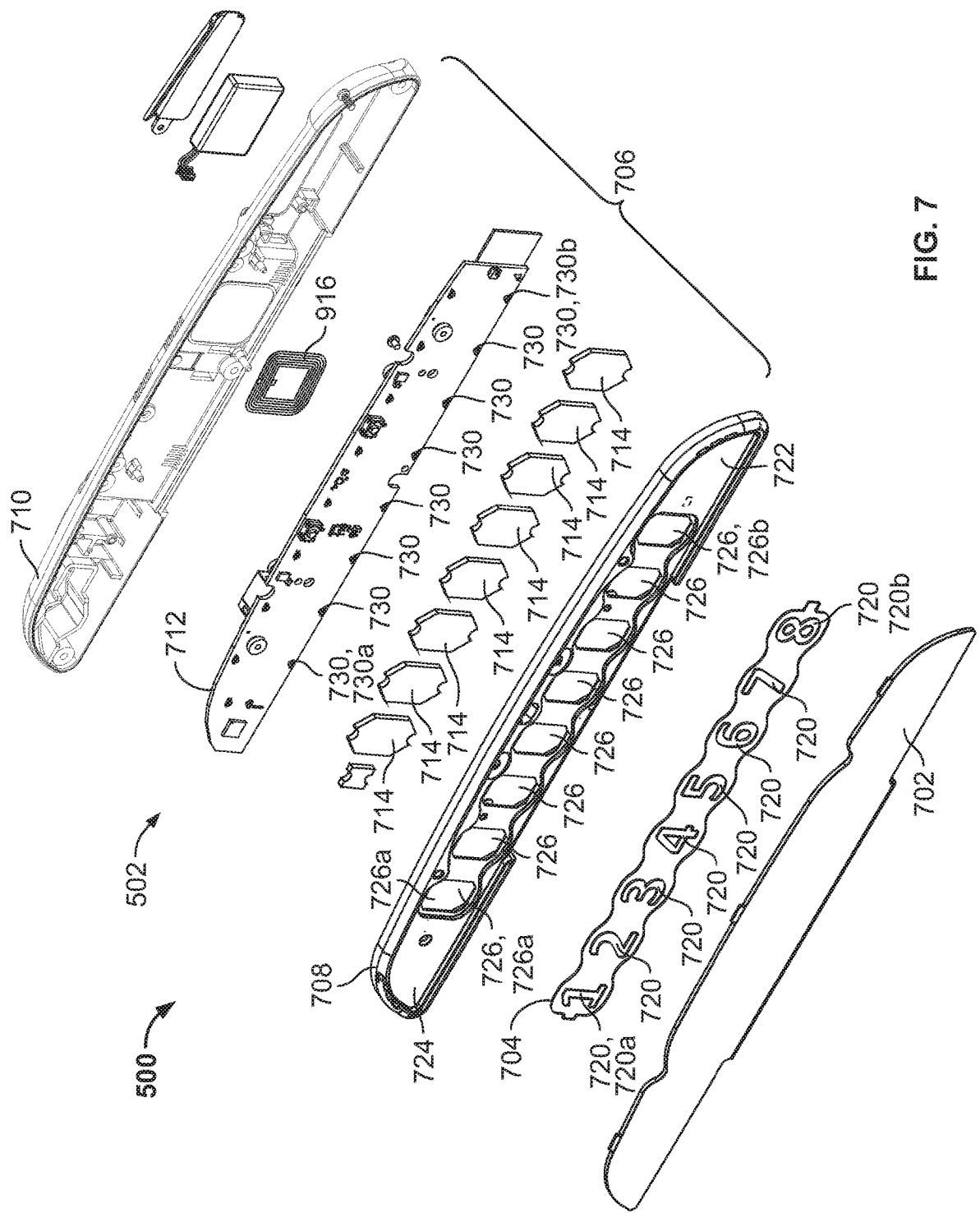
FIG. 7 is an exploded view of the example meter of FIGS. 5 and 6.

FIG. 7 is an exploded view of the example meter 500 of FIGS. 5 and 6. To provide the modular display 504, the meter 500 of the illustrated example includes an example cover 702 and an example stencil 704 that are removably coupled to an example first panel 708 of the housing 502. To house or capture example components 706 of the example meter 500, the housing 502 of the illustrated example includes the first panel 708 (e.g., a front housing portion) coupled to an example second panel 710 (e.g., a rear housing portion). The first panel 708 may be coupled to the second panel 710 via fasteners, snap fit connection, adhesive and/or any other fastening technique(s), fastener(s) and/or connector(s). The components 706 of the example meter 500 may include an example circuit board 712 (e.g. a printed circuit board) having a microprocessor, a plurality of example diffusors 714, etc.

To display identification of a panelist registered with the meter 500, the meter 500 of the illustrated example employs the stencil 704. In particular, the stencil 704 of the illustrated example includes indicia to provide a plurality of example visual indicators 720. For example, each of the visual indicators 720 may be assigned to represent a particular panelist (e.g., the panelists 106, 107 and/or 108 of FIG. 1) associated with a viewing area (e.g., the media presentation environment 104 of FIG. 1). The visual indicators 720 of the illustrated example are numerals. For example, the visual indicators 720 of the illustrated example includes eight single digit characters—one through eight. In some examples, the meter 500 of the illustrated example may represent up to eight different panelists. In addition, the visual indicators 720 of the illustrated example are in ascending order (e.g., from left to right in the orientation of FIG. 7). Further, the visual indicators 720 of the illustrated example are presented in a landscape orientation. In some examples, the visual indicators 720 or indicia may include letters or alphanumeric characters. In some examples, the visual indicators 720 or indicia may include symbols, other language characters (e.g., Chinese characters or other logograms) and/or any other indicia associated with, or used to identify, a panelist.

To receive the stencil 704, the housing 502 of the illustrated example includes an example display area 722. More specifically, the display area 722 of the illustrated example is provided by a front surface 724 of the first panel 708. The display area 722 of the housing 502 of the illustrated example includes a plurality of example openings 726. In the illustrated example, a respective one of the openings 726 is associated with (e.g., aligned with) a respective one of the visual indicators 720. For example, a first visual indicator 720a (e.g., a first numeral or indicia) of the stencil 704 is aligned with a first opening 726a and a second visual indicator 720b (e.g., a second numeral or indicia) of the stencil 704 is aligned with a second opening 726b different from the first opening 726a. In the illustrated example, the housing 502 includes eight openings 726 associated with respective ones of the eight visual indicators 720 of the stencil 704.

Each of the openings 726 is in communication with a light source such as, for example, a light emitting diode that emits light when energized. The light source of the illustrated example includes a plurality of example lights 730 (e.g., light emitting diodes) that are surface mounted to the circuit board 712. A respective one of the lights 730 is aligned with a respective one of the openings 726 to illuminate a respective one of the visual indicators 720. The example circuit board 712 of the illustrated example includes eight lights 730. Thus, a first light 730a from the plurality of lights 730 illuminates the first visual indicator 720a from the plurality of visual indicators 720 via the first opening 726a, and a second light 730b from the plurality of lights 730 illuminates the second visual indicator 720b from the plurality of visual indicators 720 via the second opening 726b, and so on. In this manner, a respective one of the lights 730 may illuminate a respective one of the visual indicators 720 of the stencil 704 aligned or associated with the respective one of the openings 726 in communication with the respective one of the lights 730. To evenly distribute or scatter light emitted by the lights 730 through the openings 726, the meter 500 of the illustrated example includes the example diffusors 714. A respective one of the diffusors 714 is positioned or aligned with a respective one of the openings 726.

The lights 730 may provide a clear (e.g., white) light, one or more colored lights (e.g., a green light, a red light, etc.), or any combination thereof. In some examples, an intensity of the lights 730 may vary (e.g., increase and/or decrease) when the meter 500 prompts a panelist to self-identify. For example, the meter 500 may cause the first light 730a to turn on and off rapidly to present the first visual indicator 720a in flashing or blinking pattern for duration of time (e.g., 20 seconds) or until a panelist self-identifies.

Alternatively, in some examples, the stencil 704 is not provided. In some such examples, the indicia (e.g., the numerals) is provided or printed on the diffusors 714. In particular, the diffusors 714 are removably coupled to the respective openings 720 via, for example, a snap-fit connection. In other words, the diffusors 714 may be accessible via the display area 722 when the cover 702 is removed from the housing 502. In some examples, the diffusors 914 may be coupled to a unitary structure or frame that is removably coupled to the display area 722. Alternatively, in some examples, the indicia are provided on the cover 702.

In some examples, the meter 500 may detect or verify if an orientation of the meter 500 and/or the housing 502 is in a proper mounting configuration or orientation (e.g., the first mounting orientation 134 of FIG. 1, the second mounting orientation 200 of FIG. 2, the third mounting orientation 300 of FIG. 3, and the fourth mounting orientation 400 of FIG. 4). For example, the meter 500 may employ an accelerometer to sense an orientation of the meter 500 and/or the housing 502.

In some examples, the meter 500 (e.g., via the microprocessor, logic circuit, etc.) determines if the housing 502 and/or the stencil 704 is in an improper mounting configuration or orientation (e.g., an orientation other than the first mounting orientation 134 of FIG. 1, the second mounting orientation 200 of FIG. 2, the third mounting orientation 300 of FIG. 3, and the fourth mounting orientation 400 of FIG. 4). In some examples, the meter 500 may determine if the housing 502 becomes dislodged or disconnected from the media device (e.g., the media device 110). For example, the meter 500 may determine if the housing 502 may have fallen behind a television and/or from a mounting surface (e.g., the mounting surface 136) if the detected orientation is not a proper mounting orientation. In some examples, the meter 500 may provide an alarm (e.g., a visual alarm via the display area 722 and/or an audible warning via a speaker) if the detected orientation is not a proper mounting orientation (e.g., an orientation other than the first mounting orientation 134 of FIG. 1, the second mounting orientation 200 of FIG. 2, the third mounting orientation 300, and the fourth mounting orientation 400 of FIG. 4).

In some examples, the example meter 500 (e.g., via a microprocessor, logic circuit, etc.) may control operation of the lights 730 based on a detected mounting orientation of the meter 500 and/or the housing 502. For example, the meter 500 may control a particular light 730 associated with a particular visual indicator 720 of the stencil 704 based on a detected mounting orientation. For example, when the example housing 502 is in a first orientation (e.g., the first mounting orientation 134 of FIG. 1 or the third mounting orientation 300 of FIG. 3, an right-side up orientation, etc.), the first light 730a is associated with the first visual indicator 720a of the stencil 704 and the second light 730b is associated with the second visual indicator 720b of the stencil 704. However, when the example housing 502 and/or the example meter 500 is in a second orientation (e.g., the second mounting orientation 200 of FIG. 2 or the fourth mounting orientation 400 of FIG. 4, an inverted orientation, etc.), the first light 730a is associated with the second visual indicator 720b of the stencil 704 and the second light 730b is associated with the first visual indicator 720a of the stencil 704 (i.e., the orientation of the lights 730 with the respective ones of the visual indicators 720 is flipped). Thus, the meter 500 may automatically assign the lights 730 to the respective one of the visual indicators 720 of the stencil 704 based on the orientation of the meter 500 and/or the housing 502.

In some examples, based on the detected orientation of the housing 502, the meter 500 (e.g., via the microprocessor, logic circuit, etc.) may verify that the stencil 704 is in a proper orientation relative to the housing 502. For example, the stencil 704 may be properly oriented relative to the housing 502 when the visual indicators 720 are oriented or in an upright orientation or right-side up position. For example, the stencil 704 may need to be inverted when the housing 502 is repositioned from a first orientation (e.g., first mounting orientation 134 of FIG. 1) to a second orientation (e.g., the second mounting orientation 200 of FIG. 2). For example, the meter 500 may verify proper stencil orientation relative to the display area 722 based on the mounting orientation of the meter 500 and/or the housing 502. In some examples, to detect an orientation or position of the stencil 704 relative to the display area 722, the meter 500 includes a sensor (e.g., a contact switch, an optical sensor, etc.). For example, to determine the orientation of the stencil 704, the sensor may be a contact switch to determine a position of a tab of the stencil 704 and/or may be an optical sensor to determine an orientation of the indicia (e.g., via an optical sensor).

In some examples, the example meter 500 may control operation of the lights 730 based on a detected orientation of the stencil 704. In some such examples, the example meter 500 may control operation of the lights 730 with or without detecting an orientation of the housing 502. For example, the meter 500 may control a particular light 730 associated with a particular visual indicator 720 of the stencil 704 based on the detected orientation of the stencil 704 alone, or in combination with the detected orientation of the housing 502. For example, the meter 500 may be configured to associate or assign the first light 730a with the first visual indicator 720a of the stencil 704 and the second light 730b with the second visual indicator 720b of the stencil 704 when a stencil sensor is in an activated condition (e.g., the sensor is activated via a tab of the stencil 704). However, the meter 500 may associate or assign the first light 730a with the second visual indicator 720b of the stencil 704 and the second light 730b with the first visual indicator 720a of the stencil 704 (i.e., the assignment or orientation of the lights 730 with the respective ones of the visual indicators 720 is flipped). Thus, the meter 500 may automatically assign the lights 730 with the respective one of the visual indicators 720 of the stencil 704 based on a detected orientation of the stencil 704.

Figure 8:
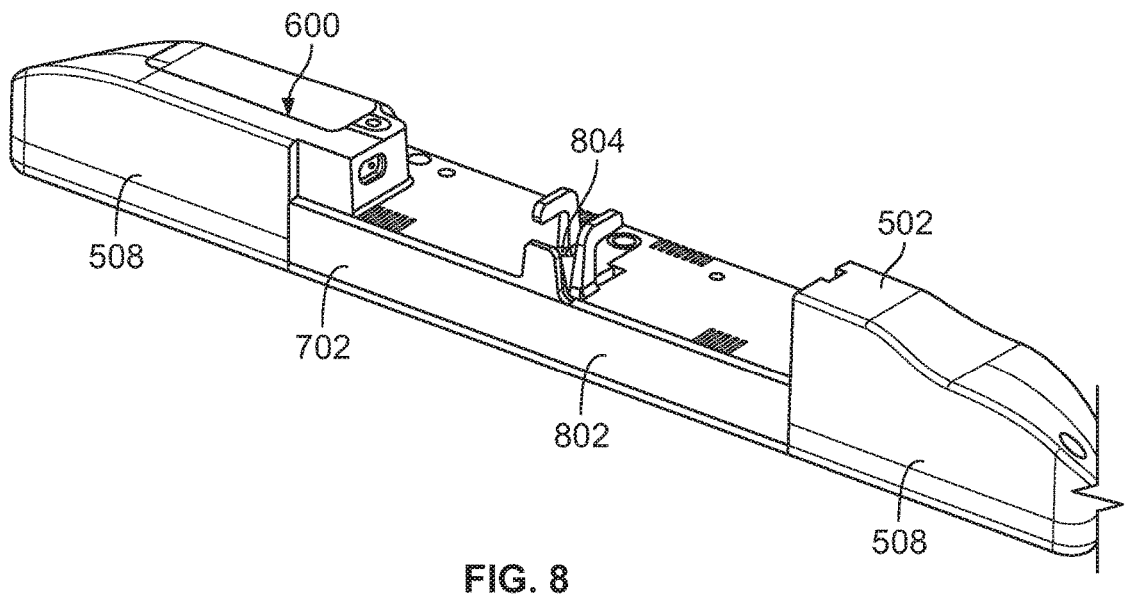
FIG. 8 is a perspective, bottom view of the example meter of FIGS. 5-7.

FIG. 8 is perspective, bottom view of the example meter 500 of FIGS. 5-7. The cover 702 of the illustrated example is removably coupled to the housing 502 via a snap-fit connection. Removing the cover 702 enables access to the stencil 704 and the display area 722. To removably couple the cover 702 to the housing 502 via a snap-fit connection, the cover 702 of the illustrated example includes an example clip 802. To enable application of a force via, for example, a finger, the clip 802 of the illustrated example includes an example grip 804. For example, a force may be applied to the grip 804 in a direction away from the housing 502 (e.g., via a user's finger) to remove the cover 702 from the housing 502. Thus, the cover 702 of the illustrated example may be removed from the housing 502 without use of a tool. In some examples, the cover 702 may employ a button (e.g., a spring-loaded button), a clamp, a fastener, and/or any other fastener(s). In the illustrated example of FIG. 8, the mounting surface 508 of the example meter 500 receives, for example, adhesive (e.g., an adhesive strip) to attach or mount the meter 500 to a media device.

Figure 9:
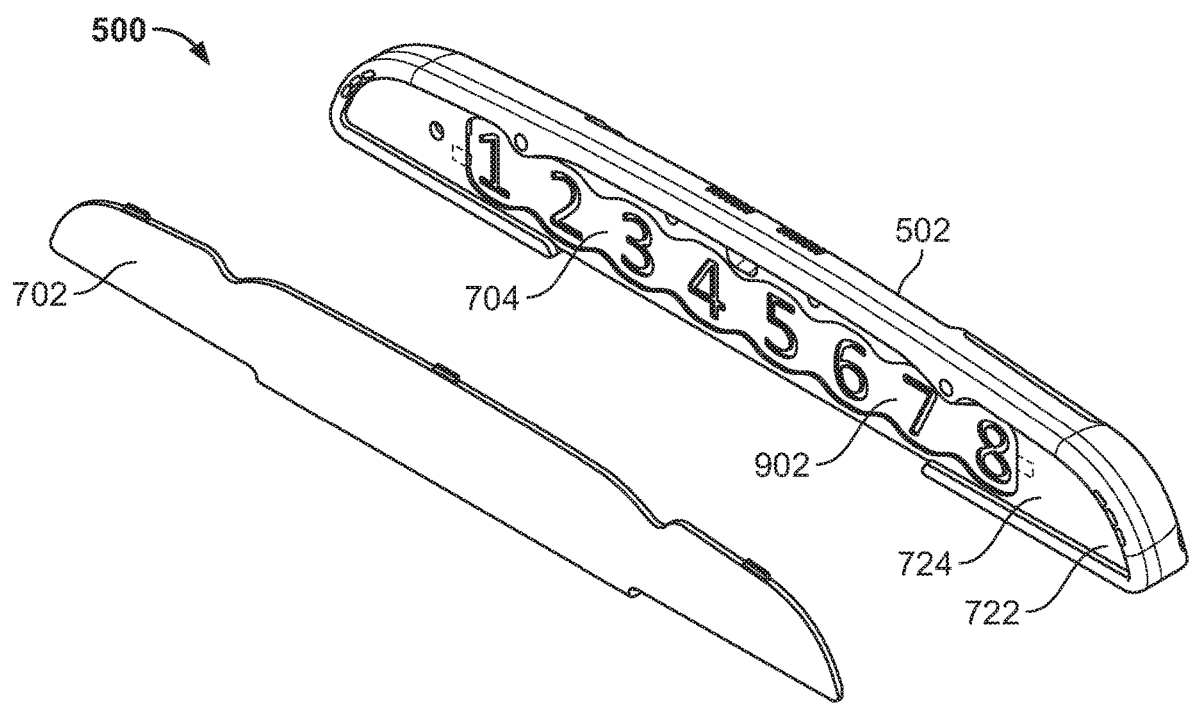
FIG. 9 is a partially assembled, perspective view of the example meter of FIGS. 5-8.

FIG. 9 is a perspective view of the example meter 500 of FIGS. 5-8. To enable access to the stencil 704 and/or the display area 722, the cover 702 is removed from the housing 502. In the illustrated example, a front surface 902 of the stencil 704 is flush mounted relative to the front surface 724 of the display area 722. In addition, the cover 702 of the illustrated example is semi-transparent to allow visual presentation of only the visual indicators 720 that are illuminated by the lights 730.

Figure 10:
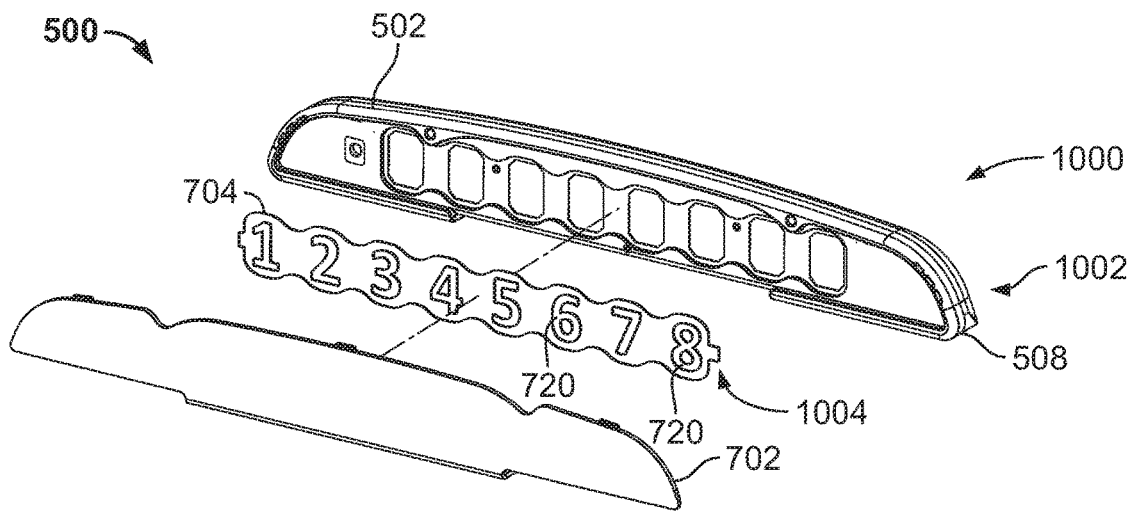
FIG. 10 is a perspective view of the example meter of FIGS. 5-9 shown in a first mounting configuration.

FIG. 10 illustrates the meter 500 of the illustrated example of FIGS. 5-9 oriented in a first example mounting configuration 1000 (e.g., corresponding to the first mounting orientation 134 of FIG. 1). In the illustrated example, the cover 702 and the stencil 704 are shown removed from the housing 502. In the illustrated example of FIG. 10, the housing 502 is oriented in a first orientation 1002 and the stencil 704 is oriented in a first direction 1004 (e.g., an upright orientation). For example, when the housing 502 is in the first orientation 1002, the mounting surface 508 of the housing 502 is oriented in a downward direction in the orientation of FIG. 10. For example, the mounting surface 508 of the housing 502 of the illustrated example is in a right-side up orientation. Further, in the first direction 1004, the stencil 704 of the illustrated example is in an upright orientation. Thus, when the lights 730 illuminate the visual indicators 720, the illuminated visual indicators 720 of the illustrated example appear in an upright orientation.

Figure 11:
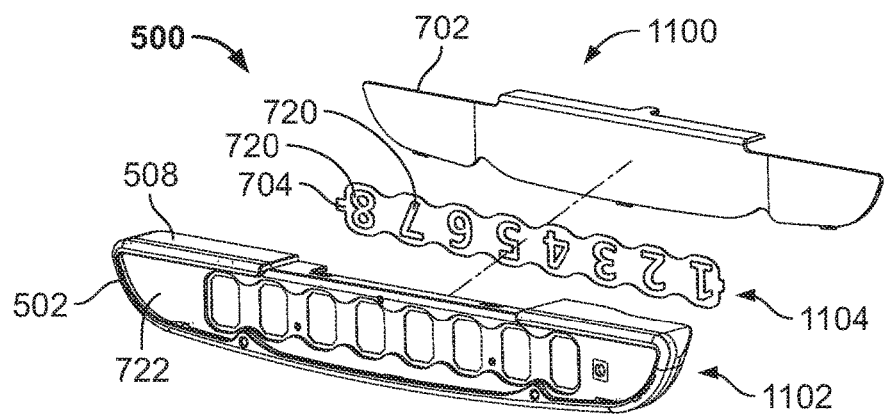
FIG. 11 is a perspective view of the example meter of FIGS. 5-10 shown in an intermediate orientation.

FIG. 11 is another perspective view of the example meter 500. Referring to FIG. 11, the meter 500 of the illustrated example is in an intermediate configuration 1100. In the illustrated example, the housing 502 is in a second orientation 1102. For example, in the second orientation 1102, the mounting surface 508 of the housing 502 of the illustrated example is oriented in an upward direction in the orientation of FIG. 11. In other words, the housing 502 shown in the illustrated example of FIG. 11 is inverted or upside-down orientation relative to the first orientation 1002 of the housing 502 shown in FIG. 10. When the housing 502 of the illustrated example is moved or rotated from the first orientation 1002 shown in FIG. 10 to the second orientation 1102 shown in FIG. 11 while the stencil 704 is positioned in the display area 722, the stencil 704 of the illustrated example is moved to a second orientation or a second direction 1104 (e.g., an upside down orientation). For example, the second direction 1104 of the stencil 704 of the illustrated example is inverted (e.g. upside down) relative to the orientation of the stencil 704 shown in FIG. 10. In other words, the visual indicators 720 of the stencil 704 of the illustrated example are inverted or upside down compared to the visual indicators 720 when the stencil 704 is in first direction 1004 of FIG. 10. To reposition (e.g., invert) the stencil 704 to the first direction 1004, the cover 702 of the illustrated example is removed from the housing 502 (e.g., after the housing 502 is rotated or inverted to the second orientation 1102) to access the stencil 704 in the display area 722. With the cover 702 removed, the stencil 704 of the illustrated example is removed from the display area 722 and moved or rotated (e.g., 180 degrees) to the first direction 1004 to present the visual indicators 720 in the upright orientation.

Figure 12:
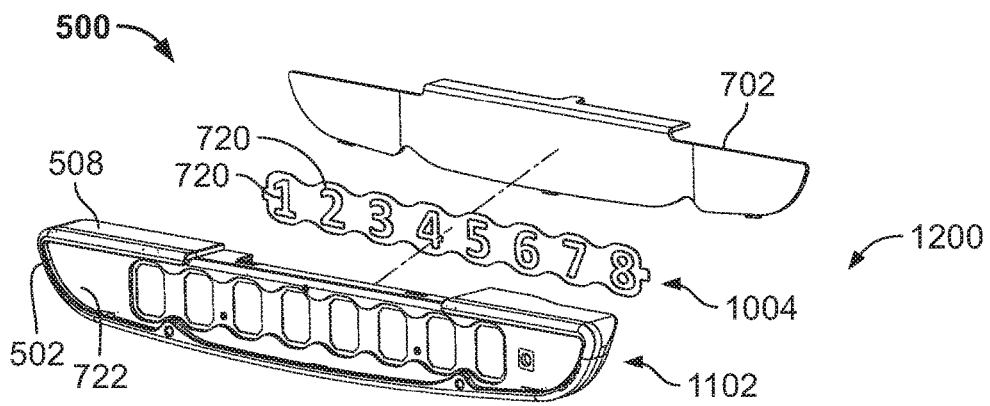
FIG. 12 is a perspective view of the example meter of FIGS. 5-11 shown in a second mounting configuration.

FIG. 12 illustrates the meter 500 of the illustrated example of FIGS. 5-11 oriented in a second example mounting configuration 1200 (e.g., corresponding to the second mounting orientation 200 of FIG. 2). In the illustrated example of FIG. 12, the housing 502 is shown in the second orientation 1102 and the stencil 704 is repositioned to the first direction 1004 (e.g., the upright orientation). For example, the visual indicators 720 of the stencil 704 of the illustrated example are shown in an upright orientation (e.g., similar to the orientation of FIG. 10). The stencil 704 of the illustrated example is coupled to the display area 722 in the first direction 1004 while the housing 502 is in the second orientation 1102. The cover 702 is then attached or coupled to the housing 502 to retain the stencil 704 in the display area 722. In this manner, when the lights 730 illuminate the respective visual indicators 720, the illuminated visual indicators 720 appear in an upright orientation even though the housing 502 (e.g., and the cover 702) is in the second orientation 1102 (e.g., an upside down orientation).

In some examples, the cover 702 and the stencil 704 may be removed from the housing 502 prior to moving the housing 502 to the second orientation 1102 shown in FIG. 11. In some such examples, the stencil 704 and the cover 702 may be properly oriented and coupled to the housing 502 after the housing 502 is moved to the second orientation 1102.

Figure 13:
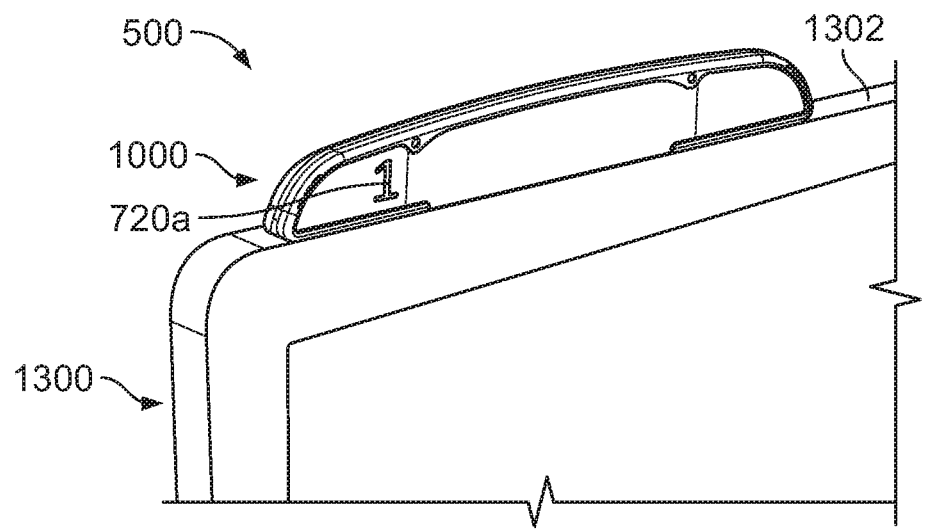
FIG. 13 illustrates the example meter of FIGS. 5-12 mounted to a media device in the first mounting configuration.

FIG. 13 is a partial, perspective view the example meter 500 mounted to an example media device 1300 (e.g., a television) in the first mounting configuration 1000. In the first mounting configuration 1000, the meter 500 of the illustrated example is configured for an above-media device mounting configuration. For example, in the first mounting configuration 1000, the meter 500 of the illustrated example is coupled to an upper surface or upper frame 1302 of the media device 1300 (e.g., via adhesive). As shown in FIG. 13, a first visual indicator 720a is illuminated to identify that a panelist (e.g., the panelist 106 of FIG. 1) assigned to the first visual indicator 720a is present in a media presentation environment (e.g., the media presentation environment 104 of FIG. 1). As shown in FIG. 13, the first visual indicator 720a of the illustrated example is in the first direction 1004 (e.g., displayed in an upright or right side up orientation). In addition, the cover 702 of the illustrated example is semi-transparent to allow visual presentation of only the illuminated visual indicators 720 (e.g., the first visual indicator 720a of the illustrated example of FIG. 13).

Figure 14:
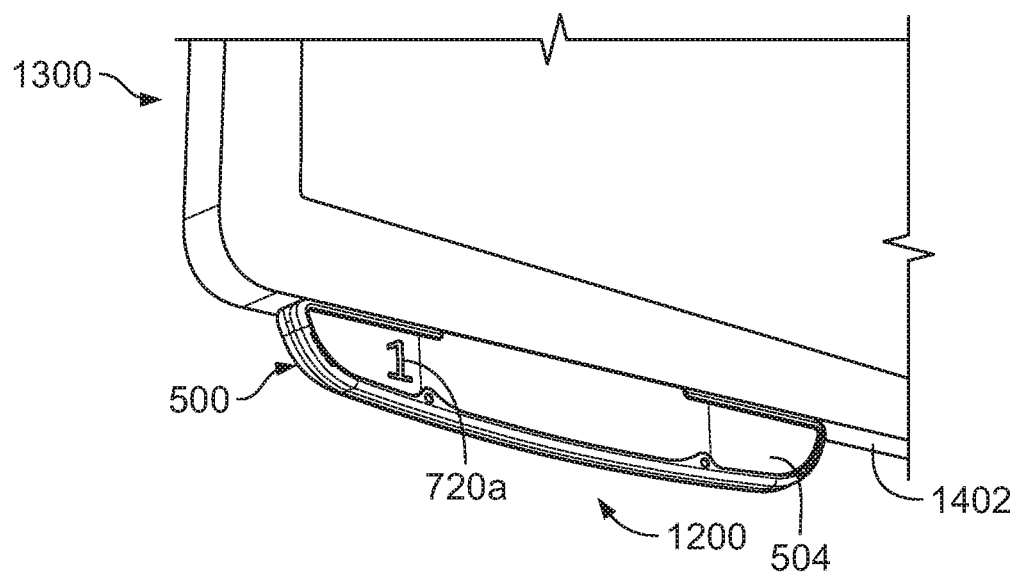
FIG. 14 illustrates the example meter of FIGS. 5-13 mounted to the media device in the second mounting configuration.

FIG. 14 is a perspective view the example meter 500 mounted to the media device 1300 in the second mounting configuration 1200. In the second mounting configuration 1200, the meter 500 of the illustrated example is configured for a below-media device mounting configuration. For example, the meter 500 of the illustrated example is coupled to a lower surface or frame 1402 of the media device 1300. As shown in FIG. 14, the first visual indicator 720a of the illustrated example is illuminated to identify that a panelist (e.g., the panelist 106 of FIG. 1) assigned to the first visual indicator 720a is present in the media presentation environment. Thus, although the housing 502 is in the second orientation 1102 (e.g., an upside down orientation), the first visual indicator 720a of the illustrated example is in the first direction 1004 (e.g., displayed in an upright or right side up orientation).

Figure 15:
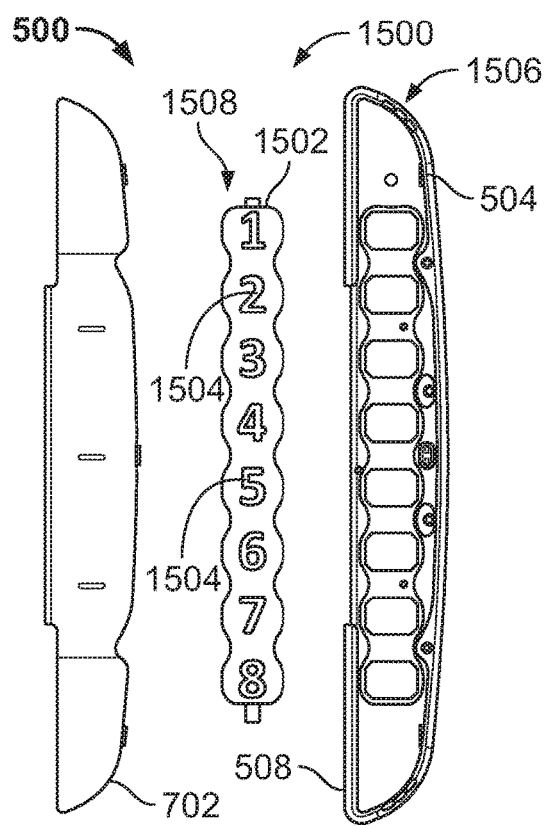
FIG. 15 is a partially exploded view of the example meter of FIG. 5 configured for mounting in a third mounting configuration.

FIG. 15 illustrates the example meter 500 configured in a third example mounting configuration 1500 (e.g., corresponding to the third mounting orientation 300 of FIG. 3). To configure the meter 500 of the illustrated example for mounting in the third mounting configuration 1500, the example meter 500 employs an example stencil 1502. The stencil 1502 of the illustrated example is different from the stencil 704 of FIGS. 5-14. In some examples, the stencil 1502 of the illustrated example is interchangeable with the stencil 704 of FIGS. 5-14 to configure the meter 500 for mounting in the third mounting configuration 1500.

Although different, the stencil 1502 of the illustrated example exhibits similarities to the stencil 704 of FIGS. 5-14. For example, the stencil 1502 of the illustrated example has a same or similar dimensional profile as the stencil 704 of FIGS. 5-14. For example, a dimensional length and/or a perimeter shape of the stencil 1502 is substantially similar to a dimensional length and/or a perimeter shape of the stencil 704 of FIGS. 5-14. In particular, the display 504 of the meter 500 and/or the display area 722 of the example housing 502 provides a modular display to enable interchangeability between different stencils such as, for example, the stencil 1502 and the stencil 704. In the illustrated example, the stencil 1502 includes visual indicators 1504 (e.g., indicia). In particular, the visual indicators 1504 are numerals presented in ascending order and in a portrait orientation in the orientation of FIG. 15. Thus, unlike the stencil 704, which presents the visual indicators 920 in a landscape orientation, the example stencil 1502 of the illustrated example presents the visual indicators 1504 in the portrait orientation. In some examples, the visual indicators 1504 may be, for example, letters, alphanumeric characters, symbols, and/or any other indicia.

In the illustrated example of FIG. 15, the cover 702 and the stencil 1502 are shown removed from the housing 502. The housing 502 of the illustrated example is shown in a third orientation 1506 and the stencil 1502 of the illustrated example is shown in a third orientation or a third direction 1508. In the third direction 1508, the visual indicators 1504 of the stencil 1502 of the illustrated example are oriented in an upright orientation. The mounting surface 508 of the housing 502 of the illustrated example is oriented in a leftward orientation in the third mounting configuration 1500 of FIG. 15.

Figure 16:
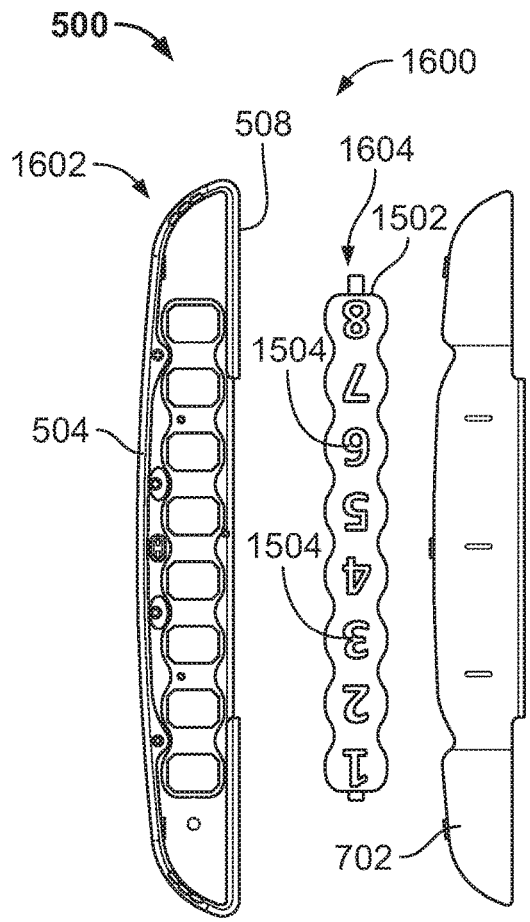
FIG. 16 is a partially exploded view of the example meter of FIG. 15 shown in an intermediate configuration.

FIG. 16 illustrates the example meter 500 of FIG. 15 in an intermediate configuration 1600. In particular, the housing 502 of the illustrated example is in a fourth orientation 1602. For example, in the fourth orientation 1602, the mounting surface 508 of the housing 502 is oriented in a rightward direction in the orientation of FIG. 16. In other words, the housing 502 shown in FIG. 16 is flipped relative to the third orientation 1506 of the housing 502 shown in FIG. 15. When the housing 502 of the illustrated example is moved or rotated from the third orientation 1506 shown in FIG. 15 to the fourth orientation 1602 shown in FIG. 16 while the stencil 1502 is positioned in the display area 722, the stencil 1502 is moved to a fourth orientation or a fourth direction 1604 (e.g., an upside down orientation). For example, the fourth direction 1604 of the stencil 1502 of FIG. 16 is inverted (e.g. upside down) relative to the orientation of the stencil 1502 shown in FIG. 15. In other words, the visual indicators 1504 of the stencil 1502 are inverted or upside down compared to the visual indicators 1504 when the stencil 1502 is in third direction 1508 of FIG. 15. To reposition (e.g., invert) the stencil 1502 to the upright orientation or the third direction 1508, the cover 702 of the illustrated example is removed from the housing 502 to access the stencil 1502 in the display area 722. With the cover 702 removed, the stencil 1502 can be removed from the display area 722 and moved or rotated (e.g., 180 degrees) so that the visual indicators 1504 are in the upright orientation or the third direction 1508.

Figure 17:
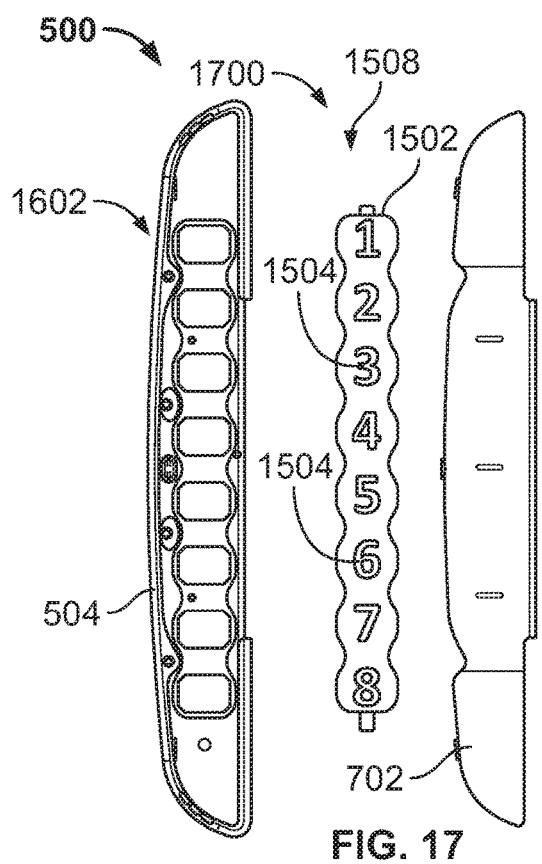
FIG. 17 is a partially exploded view of the example meter of FIGS. 15 and 16 shown in a fourth mounting configuration.

FIG. 17 illustrates the meter 500 of the illustrated example of FIGS. 15 and 16 oriented in an example fourth mounting configuration 1700 (e.g., corresponding to the fourth mounting orientation 400 of FIG. 4). In the illustrated example of FIG. 17, the housing 502 is shown in the fourth orientation 1602 and the stencil 1502 is repositioned to the third direction 1508 (e.g., the upright orientation). For example, the visual indicators 1504 of the stencil 1502 of the illustrated example are shown in an upright orientation (e.g., similar to the orientation of FIG. 15). The stencil 1502 of the illustrated example is coupled to the display area 722 in the third direction 1508 while the housing 502 is in the fourth orientation 1602. The cover 702 is then attached or coupled to the housing 502 to retain the stencil 1502 in the display area 722. In this manner, when the lights 730 illuminate the visual indicators 1504, the illuminated visual indicators 1504 appear in an upright orientation even though the housing 502 (e.g., and the cover 702) is in the fourth orientation 1602.

In some examples, the cover 702 and the stencil 1502 may be removed from the housing 502 prior to moving the housing 502 to the fourth orientation 1602 shown in FIGS. 16 and 17. In some such examples, the stencil 1502 and the cover 702 may be properly oriented and coupled to the housing 502 after the housing 502 is moved to the fourth orientation 1602.

Figure 18:
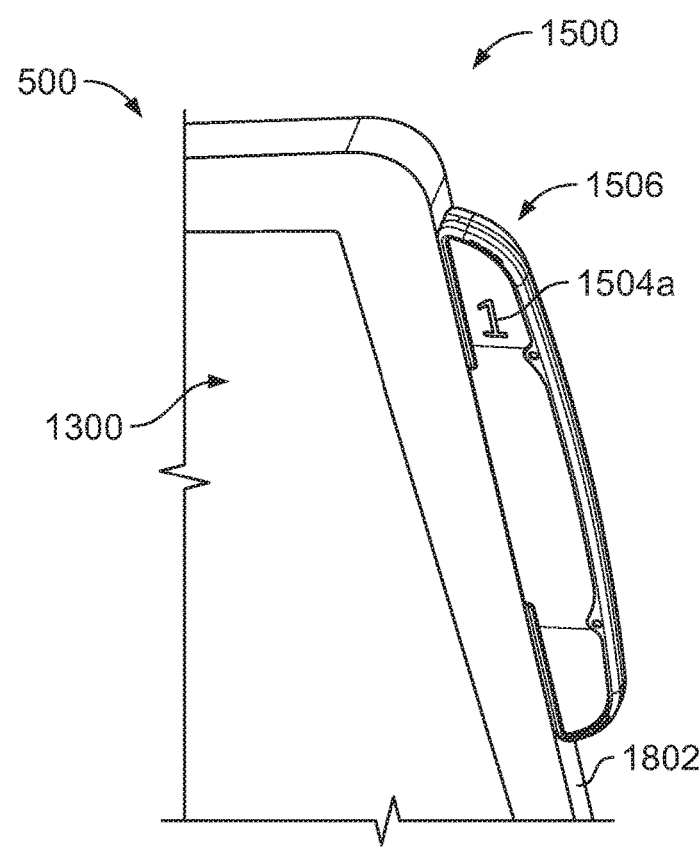
FIG. 18 illustrates the example meter of FIGS. 15-17 mounted to a media device in the third mounting configuration.

FIG. 18 is a partial, perspective view the example meter 500 mounted to the media device 1300 (e.g., a television) in the third mounting configuration 1500. In the third mounting configuration 1500, the meter 500 of the illustrated example is configured for a right-side media device mounting configuration. For example, in the third mounting configuration 1500, the meter 500 of the illustrated example is coupled to a right surface or right-side frame 1802 of the media device 1300. As shown in FIG. 18, a first visual indicator 1504a is illuminated to identify that a panelist (e.g., the panelist 106 of FIG. 1) assigned to the first visual indicator 1504a is present in a media presentation environment. As shown in FIG. 18, although the housing 502 is in the third orientation 1506, the first visual indicator 1504a of the illustrated example is in the third direction 1508 (e.g., displayed in an upright or right side up orientation).

Figure 19:
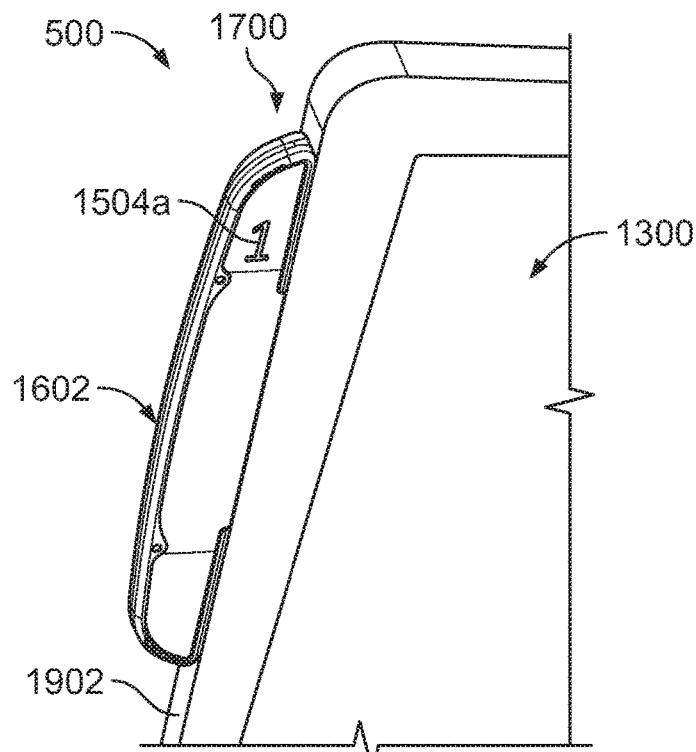
FIG. 19 illustrates the example meter of FIGS. 15-17 mounted to the media device in the fourth mounting configuration.

FIG. 19 is a perspective view the example meter 500 mounted to the media device 1300 in the fourth mounting configuration 1700. In the fourth mounting configuration 1700, the meter 500 of the illustrated example is configured for a left-side media device mounting configuration. For example, the meter 500 of the illustrated example is coupled to a left-side surface or frame 1902 of the media device 1300. As shown in FIG. 19, the first visual indicator 1504a is illuminated to identify that a panelist (e.g., the panelist 106 of FIG. 1) assigned to the first visual indicator 1504a is present in the media presentation environment. Thus, although the housing 502 is in the fourth orientation 1602, the first visual indicator 1504a of the illustrated example is in the third direction 1508 (e.g., displayed in an upright or right side up orientation).

Figure 20:
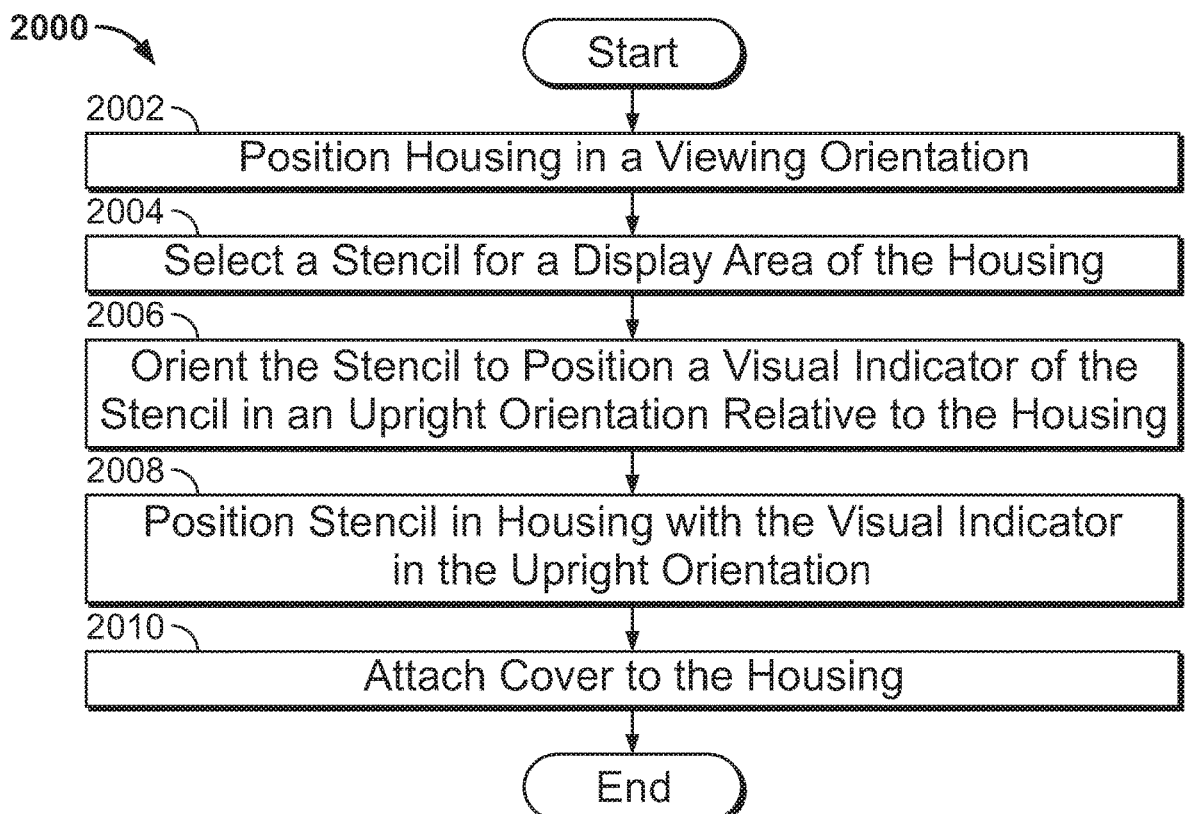
FIGS. 20-22 are flowcharts of example methods of configuring an orientation of an example meter implemented in accordance with the teachings of this disclosure.
Figure 21:
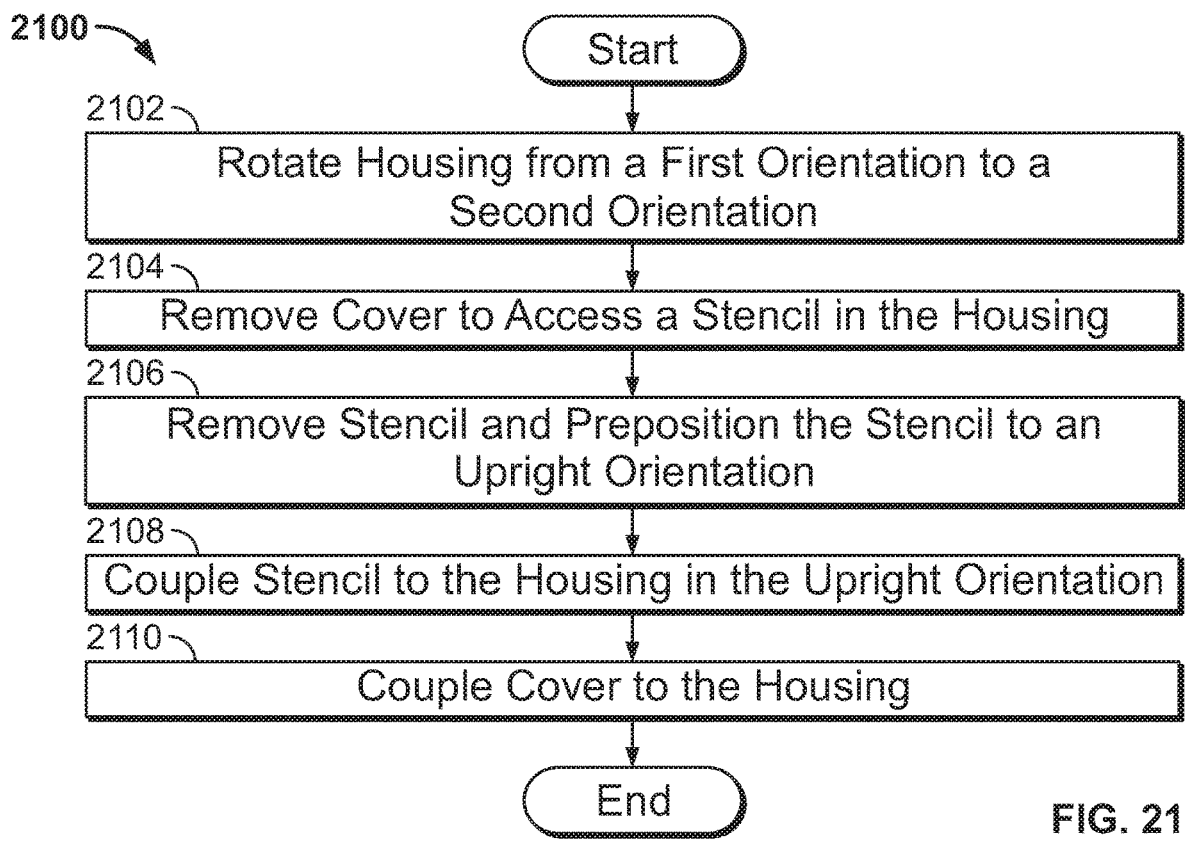
Figure 22:
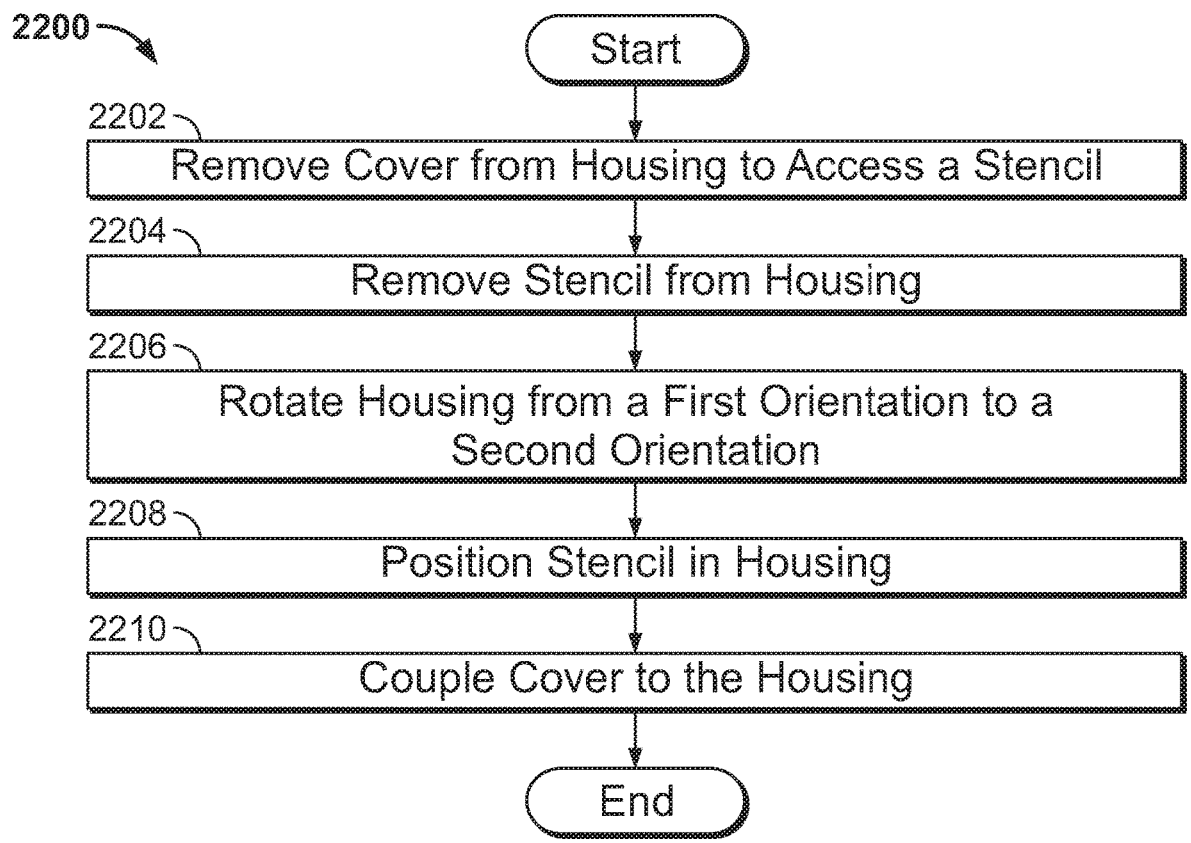

FIGS. 20-22 are flowcharts of example methods of configuring an example meter disclosed herein (e.g., the meter 102 and 500). Although the example methods 2000-2200 are described with reference to the flowcharts illustrated in FIGS. 20-22, respectively, many other methods of configuring the example meters disclosed herein (e.g., the meters 102 and/or 500) may alternatively be used. For example, the order of execution of the blocks may be changed, and/or some of the blocks described may be changed, eliminated, or combined.

Referring to FIG. 20, the method 2000 begins by positioning a housing in a viewing orientation (block 2002). For example, the housing may be positioned in the proper mounting orientation at a manufacturing facility or at a home of a panelist (e.g., the panelist 106). In some examples, the housing may be removed from a media presentation device (e.g., the media device 110 and/or 1300) to change a mounting orientation of a meter (e.g., the meter 102 and/or the meter 500). For example, the housing 502 of the illustrated example may be positioned in the first orientation 1002, the second orientation 1102, the third orientation 1506 and/or the fourth orientation 1602 (e.g., at the media device 110 or 1300, the factory, etc.).

A stencil is selected for a display area of the housing (block 2004). For example, the stencil 704 may be selected for the display area 722 when the housing 502 is to be oriented in the first orientation 1002 or the second orientation 1120, and the stencil 1502 may be selected when the housing 502 is to be oriented in the third orientation 1506 or the fourth orientation 1602. In some examples, a different stencil having letters, symbols, foreign language symbols, and/or any other indicia and/or combination(s) thereof may be selected.

The selected stencil is oriented to position a visual indicator of the stencil in an upright orientation relative to the housing (block 2006). For example, the stencil 704 may be oriented in the first direction 1004 when the housing 502 is in the first orientation 1002 such that the visual indicators 720 (e.g., indicia) are oriented in an upright orientation. In some examples, the stencil 1502 may be oriented in the third direction 1508 when the housing 502 is in the third orientation 1506 such that the visual indicators 1504 (e.g., indicia) are oriented in an upright orientation.

The stencil is positioned in the housing with the visual indicators in the upright orientation (block 2008). For example, the stencil 704 or the stencil 1502 is positioned in the display area 722 of the housing 502. A cover is then attached to the housing (block 2010). For example, the cover 702 is removably coupled to the housing 502 via snap-fit connection after the stencil 704 or the stencil 1502 is positioned in the display area 722 of the housing 502.

Referring to FIG. 21, the method 2100 of the illustrated example begins by rotating a housing from a first orientation to a second orientation (block 2102). For example, the housing 502 is rotated from the first orientation 1002 of FIG. 10 to the second orientation 1102 of FIGS. 11 and 12. In some examples, the housing 502 is rotated from the third orientation 1506 of FIG. 15 to the fourth orientation 1602 of FIGS. 16 and 17.

A cover is removed from the housing to access a stencil (block 2104). For example, the cover 702 is removed from the housing 502 when the housing 502 is in the second orientation 1202 or, alternatively, when the housing 502 is in the fourth orientation 1602.

With the cover removed from the housing, the stencil is removed from the housing and repositioned (e.g., rotated or flipped) to an upright orientation (block 2106). For example, the stencil 704 or the stencil 1502 is removed from the housing 502. In some examples, the stencil 704 is repositioned from the second direction 1104 to the first direction 1004 as shown in FIGS. 10-12. In some examples, the stencil 1502 is repositioned from the fourth direction 1604 to the third direction 1508 as shown in FIGS. 15-17. As a result, the visual indicators 720 or 1504 of the respective stencils 704 or 1502 are in an upright orientation relative to the housing 502 when the stencil 704 or the stencil 1502 are positioned in the first directions 1104 and 1508, respectively.

The stencil is coupled to the housing in the upright orientation (block 2108). For example, the repositioned stencil 704 or the stencil 1502 is positioned in the display area 722 with the visual indicators 720 or 1504 in the upright orientation as shown, for example, in FIGS. 12 and 17, respectively. The cover is coupled to the housing (block 2110). For example, the cover 702 is reattached to the housing 502 after the stencil 704 or the stencil 1502 is properly oriented in the display area 722.

Referring to FIG. 22, the method 2200 begins by removing a cover from a housing to access a stencil (block 2202) For example, the cover 702 is removed from the housing 502 to access the stencil 704 or the stencil 1502 in the display area 722 of the housing 502. The stencil is removed from the housing (block 2204). For example, the stencil 704 or the stencil 1502 is removed from the display area 722. The housing is rotated from a first orientation to a second orientation (block 2206). In some examples, the housing 502 is rotated from the first orientation 1002 shown, for example, in FIG. 10 to the second orientation 1102 shown, for example, in FIG. 12. In some examples, the housing 502 is rotated from the third orientation 1506 shown, for example, in FIG. 15 to the fourth orientation 1602 shown, for example, in FIG. 17. The stencil is positioned in the housing (block 2208). For example, the stencil 704 or the stencil 1502 is positioned in the display area 722 of the housing 502 such that the visual indicators 720 or 1504 are in the upright orientation. The cover is then coupled to the housing (block 2210). For example, the cover 702 is reattached to the housing 502.

The example methods 2000-2200 of FIGS. 20-22 may be performed in the field (e.g., at the media presentation environment 104 of FIG. 1), a manufacturing facility, a ratings company, and/or any other location(s). For example, a manufacturing company may supply a person with a kit including the housing 502, the cover 702, the stencil 704 and the stencil 1502 and the person (e.g., the panelist 106) may configure the meter 500 for a desired mounting configuration relative to a media device (e.g., the media device 110 or 1300). In some examples, the meters disclosed herein may be received by a panelist in a fully assembled state (e.g., as shown in FIG. 5) and the panelist may configure the mounting configuration at the media presentation environment 104.

At least some of the aforementioned examples include one or more features and/or benefits including, but not limited to, the following:

In some examples, an invertible meter apparatus for monitoring a media device includes a housing having a display area. In some such examples, the housing is to be positioned in a first orientation or a second orientation different than the first orientation. In some such examples, a stencil removably coupled to the display area of the housing. In some such examples, the stencil has indicia to be positioned in the display area of the housing in an upright orientation when the housing is in the first orientation. In some such examples, the stencil is repositionable to orient the indicia to the upright orientation when the housing is moved to the second orientation. In some such examples, a cover is removably coupled to the housing to enable access to the stencil in the display area.

In some such examples, the stencil is interchangeable with another stencil.

In some such examples, the stencil includes indicia representative of a panelist.

In some such examples, the stencil includes a plurality of numbers in ascending order.

In some such examples, the first orientation enables above-television mounting and the second orientation enables below-television mounting.

In some such examples, the indicia of the stencil is oriented in a landscape orientation.

In some such examples, the indicia of the stencil is oriented in a portrait orientation.

In some such examples, the stencil includes a first stencil and a second stencil. In some such examples, the first stencil is interchangeable with the second stencil. In some such examples, the first stencil includes indicia in a landscape orientation and the second stencil includes indicia in a portrait orientation.

In some examples, a method includes positioning a housing of an invertible media device meter in a viewing orientation. In some such examples, the method includes selecting a stencil for a display area of the housing, the stencil having indicia. In some such examples, the method includes orientating the stencil to position the indicia in an upright orientation relative to the housing; positioning the stencil in the display area of the housing with the indicia in the upright orientation. In some such examples, the method includes attaching a cover to the housing.

In some such examples, the positioning of the housing in the viewing orientation includes orientating the housing in at least one of a first viewing orientation or a second viewing orientation, the first viewing orientation being different than the second viewing orientation.

In some such examples, the indicia include at least one of numeric characters, letters, or alphanumeric characters.

In some examples, a method includes orientating a housing of an invertible media device meter in at least one of a first orientation or a second orientation, where the first orientation is different than the second orientation. In some such examples, the method includes orientating a first stencil in an upright orientation relative to the housing when the housing is in the at least one of the first orientation or the second orientation. In some such examples, the method includes coupling the first stencil to the housing in the upright orientation.

In some examples, the method includes attaching a cover to the housing to cover the first stencil.

In some examples, the method includes mounting the housing to an upper surface of a media device when the housing is in the first orientation or mounting the housing to a lower surface of the media device when the housing is in the second orientation.

In some examples, the method includes orientating the housing from the first orientation to the second orientation while the first stencil is positioned in the housing. In some such examples, the method includes removing the first stencil from the housing. In some such examples, the method includes reorienting the first stencil to the upright orientation. In some such examples, the method includes coupling the first stencil to the housing in the upright orientation when the housing is in the second orientation.

In some such examples, removing the first stencil from the housing includes removing a cover from the housing to access the first stencil.

In some examples, the method includes, prior to orientating the first stencil to the upright orientation, selecting the first stencil from a plurality of different stencils.

In some examples, the method includes interchanging a second stencil previously included in the housing with the first stencil, the second stencil being different than the first stencil.

In some examples, a method includes rotating a housing of an invertible media device media from a first mounting orientation to a second mounting orientation while a stencil is positioned in a display area of the housing, where the first mounting orientation is different than the second mounting orientation. In some such examples, the method includes removing a cover from the housing to access the stencil positioned in the display area when the housing is in the second orientation. In some such examples, the method includes removing the stencil from the housing. In some such examples, the method includes rotating the stencil to an upright orientation relative to the housing. In some such examples, the method includes positioning the stencil in the display area in the upright orientation. In some such examples, the method includes coupling the cover to the housing to cover the stencil.

In some examples, the method includes interchanging the stencil with a different stencil.

In some such examples, the rotating of the stencil includes inverting the stencil.

In some examples, the method includes removing the housing from an upper surface of a media device prior to rotating the housing to the second orientation.

In some examples, the method includes attaching the housing to a bottom surface of the media device opposite the upper surface after rotating the housing to the second orientation.

In some such examples, rotating the housing includes inverting the housing.

In some such examples, rotating the housing or the stencil includes rotating the housing or the stencil a rotation of approximately 180 degrees.

In some examples, a method includes removing a cover from a housing of an invertible media device meter when the housing is in a first orientation to access a display area of the housing. In some such examples, the method includes removing a stencil from the display area of the housing. In some examples, the method includes rotating the housing from the first orientation to a second orientation different than the first orientation. In some such examples, the method includes positioning the stencil in the display area of the housing when the housing is in the second orientation. In some such examples, the method includes coupling the cover to the housing to cover the stencil.

In some such examples, the orientating of the housing in the first orientation enables the housing to be mounted on an upper surface of a media device.

In some such examples, orientating the housing in the second orientation enables the housing to be mounted on a bottom surface of a media device.

Although certain example apparatus, methods, and articles of manufacture have been disclosed herein, the scope of coverage of this patent is not limited thereto. On the contrary, this patent covers all apparatus, methods, and articles of manufacture fairly falling within the scope of the claims of this patent.

What is claimed is:

1. A meter to monitor a media device, the meter comprising:
a housing structured to be positioned in a first orientation or a second orientation different than the first orientation, the housing structured to couple to at least one of a side surface or an edge of a media presentation device, the housing including:
a display having a plurality of walls, respective ones of the walls being positioned between respective ones of openings such that the openings are isolated from adjacent ones of the openings; and
a removable stencil including a plurality of visual indicators, the visual indicators to align with respective ones of the openings.

2. The meter of claim 1, further including a cover removably coupled to the housing to enable access to the stencil.

3. The meter of claim 1, further including a light supported by the housing.

4. The meter of claim 1, wherein the housing is positionable in a first orientation or a second orientation inverted from the first orientation.

5. The meter of claim 1, wherein the stencil is interchangeable with another stencil.

6. The meter of claim 1, wherein the visual indicators include a plurality of numbers in ascending order.

7. The meter of claim 1, wherein the visual indicators of the stencil are in a landscape orientation.

8. The meter of claim 1, wherein the visual indicators of the stencil are in a portrait orientation.

9. The meter of claim 1, wherein the stencil is a first stencil and further including a second stencil, the first stencil being interchangeable with the second stencil, the visual indicators of the first stencil in a landscape orientation and the second stencil including visual indicators in a portrait orientation.

10. The meter of claim 3, wherein the light includes a plurality of lights, respective ones of the lights to illuminate respective ones of the openings such that light emitted from the respective ones of the lights passes through corresponding ones of the openings to illuminate the respective ones of the visual indicators via the stencil.

11. The meter of claim 4, wherein the visual indicators are to be positioned in the in an upright orientation when the housing is in the first orientation, the stencil being repositionable to orient the visual indicators to the upright orientation when the housing is moved to the second orientation.

12. A meter to monitor a media device, the meter comprising:
a housing selectively repositionable between a first orientation and a second orientation different than the first orientation and structured to couple to at least one of a side surface or an edge of a presentation device, the housing having a display area including a plurality of spaced-apart openings;
a stencil removably coupled to the display area of the housing, the stencil including a plurality of spaced-apart visual indicators, respective ones of the visual indicators to align with respective ones of the openings; and
a plurality of lights supported by the housing, respective ones of the lights being positioned to illuminate respective ones of the openings such that light emitted from the respective ones of the lights passes through the respective ones of the openings to illuminate the respective ones of the visual indicators when the stencil is coupled to the display area.

13. The meter of claim 12, further including a cover removably coupled to the housing to enable access to the stencil positioned in the display area.

14. The meter of claim 12, further including a plurality of walls, respective ones of the walls positioned between respective ones of the openings, the walls to restrict passage of light therethrough.

15. The meter of claim 12, wherein the stencil is a first stencil and further including a second stencil, the first stencil being interchangeable with the second stencil, the first stencil having first visual indicators in a first language and the second stencil having second visual indicators in a second language different than the first language, each of the first stencil and the second stencil to be positionable separately and removably in the display area of the housing.

16. The meter of claim 12, wherein the housing defines a recess to receive the stencil, the recess having a first profile corresponding to a second profile defined by a perimeter of the stencil, the perimeter of the stencil to engage an edge of the housing defined by the recess when the stencil is positioned in the recess, a portion of the stencil to extend beyond the edge defined by the recess when the stencil is positioned in the recess.

17. The meter of claim 16, wherein the portion of the stencil is a tab protruding from the perimeter of the stencil.

18. A meter to monitor a media device, the meter comprising:
a housing structured to be repositionable between a first orientation and a second orientation different than the first orientation and the housing structured to couple to at least one of a side surface or an edge of a presentation device, the housing having a display area including a plurality of openings;
a plurality of lights supported by the housing, respective ones of the lights positioned to illuminate respective ones of the openings; and
a stencil removably coupled to the display area of the housing, the stencil including a plurality of visual indicators, respective ones of the visual indicators to align with respective ones of the openings to enable light emitted from the respective ones of the lights passing through the respective ones of the openings to illuminate the respective ones of the visual indicators when the stencil is coupled to the display area.

19. The meter of claim 18, further including a cover removably coupled to the housing to enable access to the stencil in the display area.

20. The meter of claim 18, wherein the display area includes a planar surface that includes the openings.

\* \* \* \* \*